United States Patent [19]

Horton

[11] Patent Number: 4,723,320

[45] Date of Patent: Feb. 2, 1988

[54] DUAL COMMUNICATION LINK FOR SATELLITE TV RECEIVER

[75] Inventor: Edwin T. Horton, Ballwin, Mo.

[73] Assignee: Satellite Technology Services, Inc., St. Louis, Mo.

[21] Appl. No.: 717,225

[22] Filed: Mar. 28, 1985

[51] Int. Cl.$^4$ .............................................. H04B 1/16
[52] U.S. Cl. .................................... 455/186; 455/151; 455/261; 358/349
[58] Field of Search ....................... 455/3, 4, 185, 186, 455/26.1; 358/114, 86, 122, 349; 343/352, 356, 357; 342/357, 356

[56] References Cited

U.S. PATENT DOCUMENTS

| | | | |
|---|---|---|---|
| 3,452,356 | 6/1969 | Stoney | 455/25 |
| 4,317,213 | 2/1982 | Di Lorenzo | 358/114 |
| 4,425,579 | 1/1984 | Merrell | 455/3 |
| 4,510,623 | 4/1985 | Bonneau et al. | 358/114 |

Primary Examiner—Robert L. Griffin
Assistant Examiner—Elissa Seidenglanz
Attorney, Agent, or Firm—Rogers, Howell, Moore & Haferkamp

[57] ABSTRACT

A satellite television reception only receiver includes a programmable microprocessor which has a communications link for communicating between a plurality of receivers connected in a multiple receiver installation. An antenna is connected to only one receiver in the network, and it controls operation of the antenna, and the information relating to the antenna is transmitted to the other receivers to update them. The microprocessor further provides a means to programmably restrict access to particular satellites or transponders on satellites at each individual receiver, and vary the particular transponders or satellites restricted from receiver to receiver.

14 Claims, 3 Drawing Figures

DUAL COMMUNICATION LINK FOR SATELLITE TV RECEIVER

BACKGROUND AND SUMMARY

Satellite television receivers which decode satellite broadcast television signals for display by a television monitor are well known in the art. These receivers are commonly used in earth stations by homeowners in connection with an antenna to directly receive satellite broadcast television signals from one of a number of satellites in geosynchronous orbit about the equator. These satellite television reception only (TVRO) systems are very popular in rural areas where conventional broadcast programming is unavailable, and even in those areas where cable is not yet available as it provides an incredibly broad range of programming to choose from. These satellite receivers are generally coupled with an associated actuator which is controllable by the operator to change the positioning of the antenna from one satellite to another. Additionally, as well known in the art, each satellite has up to twenty-four transponders, each transponder being capable of transmitting a television broadcast. To increase the channel separation, every other transponder broadcasts its signal in either a vertical or horizontal polarity. Thus, all of the odd transponders of a satellite might transmit their signals of a vertical polarity while the even transponders transmit their signal in a horizontal polarity. Unfortunately, this polarization is not consistent for all satellites in that the Westar and Galaxy satellites have horizontal polarity for odd transponders and vertical polarity for even transponders.

To enhance the convenience of the receiver, remote controls are commonly available in the prior art which permit an operator to sit across the room in his favorite chair while he controls the operation of the antenna and the transponder signal being received and displayed. These remote controls generally have buttons corresponding to each of the more common satellites, volume control, azimuth adjust for correcting minor errors in the antenna, sound level, and other miscellaneous controls as might vary from manufacturer to manufacturer. For those homes having more than one television, there are many different ways in which receivers have been connected in the prior art to accommodate multiple televisions. However, there has existed problems and inconveniences with multiple receiver installations. For example, the antenna may only be pointed at one satellite at any one time. Thus, there may only be one receiver which has control of the antenna. Furthermore, as the antenna is moved from satellite to satellite, there is no means to automatically update the display at each of the other receivers so that they accurately display the correct satellite being received. There has been developed in the prior art a remote controller which may be located adjacent a secondary receiver and which will change the positioning of the antenna to another satellite upon request at the remote receiver, however there is no confirmation that the antenna has in fact reached the other satellite as it is a one-way link with no feedback. Furthermore, none of the other receivers are provided information as to the new satellite such that viewers have no idea which satellite is being viewed at any one time.

Still another problem which exists in the prior art results from the very fact that a wide variety of programming is available with the satellite TVRO system. Some satellites presently broadcast what some may consider to be objectionable material, and it would be desirable for some installations to be able to program one or more of the receivers to restrict the access of that receiver to certain satellites or certain transponders in certain satellites. In the prior art, an operator could lock out an entire satellite by making an entry at the actuator control (the actuator control being the controller for the antenna) and this would lock out reception from all of the transponders at a single satellite. Also, any receiver could be programmed to lock out one transponder, for example transponder number 10, but that lockout would be independent of the particular satellite being viewed such that no transponder 10 could be viewed on any of the many satellites in orbit. Obviously, this limited selectivity on programming access is overly restrictive and insufficiently selective as there may be many unobjectionable signals which are locked out with the objectionable signals using the systems available in the prior art.

To solve these and other problems, the inventor herein has succeeded in designing and developing a combination receiver actuator unit which incorporates a microprocessor and a communication link which facilitates its connection in a network of receivers and which provides the more desirable features heretofore unavailable with the products available in the prior art. With the receiver of the present invention, a switch is provided to permit the operator to select whether the receiver is to be the master receiver of a network, or one of the slaves. The master receiver is connected directly to the antenna, and all of the slave receivers are connected to the master receiver. Therefore, the master receiver directly controls the antenna and antenna instructions entered at each of the slave units must first be communicated to the master unit before execution by the master. Furthermore, there is a communication link which interconnects the microprocessors of each of the master and slave receivers such that the slaves quiz the master as to the location of the antenna as each slave is turned on. Additionally, as the antenna is moved in response to instructions entered either at the master or at any of the slave receivers, the position of the antenna is automatically updated at each of the other slave units.

One of the more valuable features of this new receiver actuator unit is the programmable feature which an operator may utilize to lock out particular transponders of particular satellites, or even entire satellites at any slave. Furthermore, the particular transponders or satellites locked out at any slave may be different than those locked out at any other slave. To facilitate programming, all slaves may be simultaneously locked out of any particular transponder or satellite by programming entered at the master receiver.

To further enhance the lock-out programming capability, the receiver has been designed such that the remote control is necessary to change the programming. Thus, absolute security can be ensured merely by removing the remote control from physical possession of unauthorized persons. For example, the parents may desire to take the remote control with them should they leave the house for an evening to prevent a particularly adept child from reprogramming any of the receivers to gain access to the restricted transponders. This can be very important as children are oftentimes much more skilled at operating computers and other sophisticated consumer electronic devices than their parents. This programming function can be achieved by utilizing data entry buttons on the face of the receiver, and data entry buttons on the face of the remote control.

Still another feature which is available with the receiver of the present invention and which has been unavailable with receivers of the prior art is the automatic display of correct polarization for transponders on any particular satellite. As mentioned above, polarization for odd and even transponders is inconsistent from satellite to satellite. With the programmable microprocessor incorporated into the receiver of the present invention, and with the software included at the end of the Specification section herein, the receiver will automatically indicate the correct polarization for each transponder set on each particular satellite.

The principal advantages and features of the present invention have been described. However, a greater understanding and appreciation for the invention may be obtained by referring to the drawings and detailed description of the preferred embodiment which follows.

DETAILED DESCRIPTION OF THE PREFERRED EMBODIMENT

Figure 1:
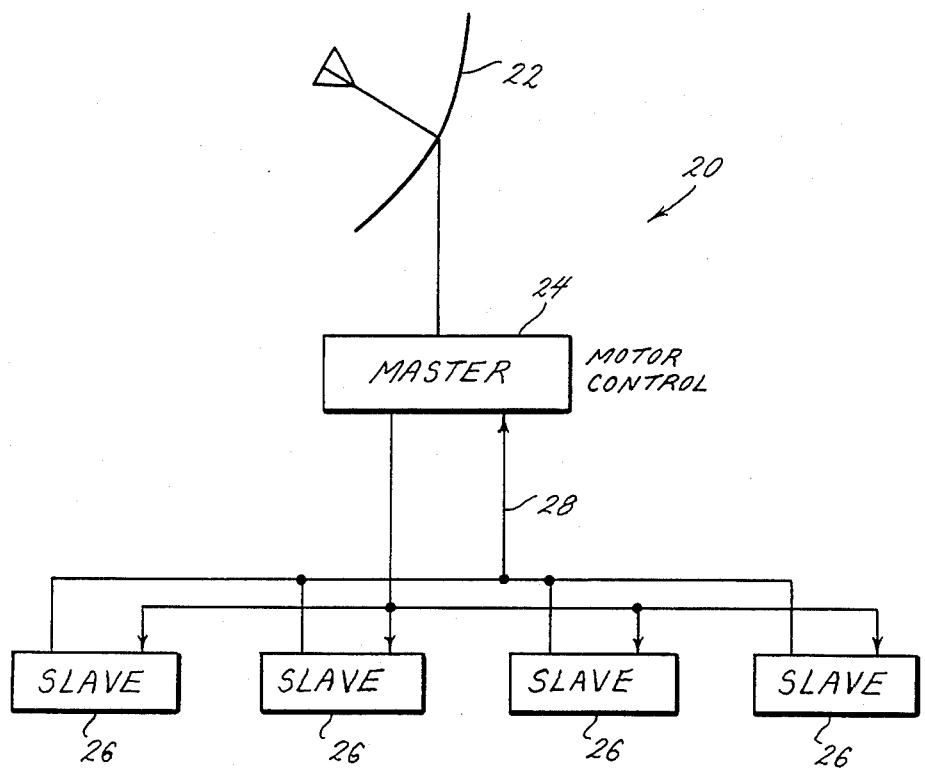
FIG. 1 is a block diagram showing a typical multiple receiver installation.

As shown in FIG. 1, a typical satellite TVRO reception system 20 includes an antenna 22 and a master receiver unit 24 having the necessary controls to move the antenna 22 from satellite to satellite, and a plurality of slave receiver units 26 which interconnect with the master receiver unit 24 via a communications link 28. In the preferred embodiment, this communications link 28 is hard-wired, although other similar telemetry means could be utilized such as RF or low frequency digital signaling, as known in the art.

Figure 2:
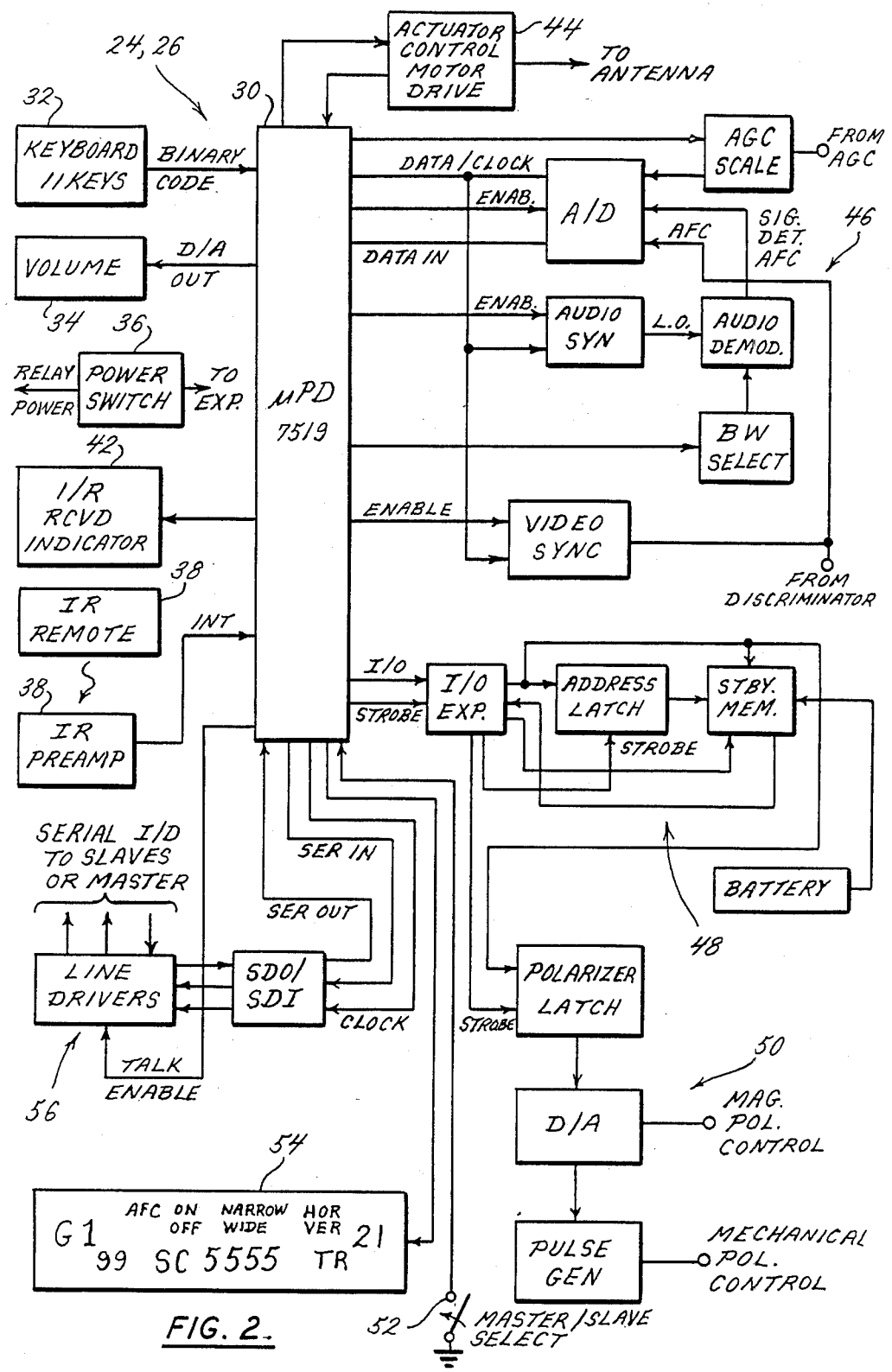
FIG. 2 is a block diagram of the electrical schematic for the receiver of the present invention.

The block diagram for a receiver unit 24, 26 is shown in FIG. 2 and includes at its heart a microprocessor 30 which provides the stored program control. The software at the end of the Detailed Description section represents the program stored in microprocessor 30 and executed thereby to perform the functions and features described herein. Connected to the microprocessor 30 is the receiver keyboard 32, as is better shown in FIG. 3 as the face plate of the receiver 24, 26 and it has eleven data entry keys for entering data to the microprocessor 30. A volume control 34 is also connected, and power switch 36, as known in the art. An IR remote control 36 transmits a signal which is received by the IR preamplifier 40 which is then input to the microprocessor 30, as shown. An IR received indicator 42 responds to the IR remote 38, as known in the art. An actuator motor drive 44 controls the antenna, as known in the art. The audio and video signals are controlled by an audio video section 46, and a battery back-up circuit 48 provides power failure protection. A polarizer circuit 50 provides both magnetic and mechanical outputs for selecting proper polarization from the antenna, as known in the art. A master slave switch 52 inputs to the microprocessor 30 an operator designation to the receiver as to whether it is a master receiver 24 or a slave receiver 26, as shown connected in FIG. 1. The display 54 on the front of the receiver is also connected to and driven by a microprocessor 30 to provide visual information to the operator as the receiver is being used. A serial IO communication link 56 interconnects the microprocessor 30 of the receiver unit 24, 26 with a similar microprocessor unit in another receiver in the network, as shown in FIG. 1.

Figure 3:
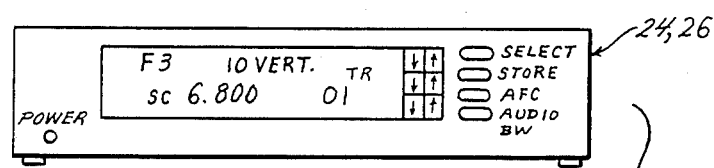
FIG. 3 is a front view of the panel of the receiver of the present invention and its remote control.
Figure 3:
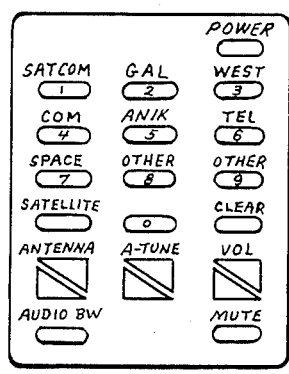

The front panel of receiver 24, 26 and an associated remote control 38 is shown in FIG. 3, each of which includes a plurality of data entry buttons for utilization in the programming mode. For the receiver 24, 26 the select button and the store button are utilized, and the satellite and clear buttons of the remote control unit 38 are specifically designated as data entry buttons for use in programming. The other controls are provided and utilized as known in the art in connection with other types of receivers and remote controls.

Operation

The programming of the receiver unit of the present invention is designed to be somewhat intricate and requires some careful attention to avoid the inadvertent programming of the receiver as the unit is used. De-programming of the receiver is even more intricate to minimize the possibility that unauthorized de-programming of the receiver may take place without the specific knowledge and instructions made available.

If the programming to be described is entered at the master receiver, then all slave units are similarly programmed or de-programmed, as appropriate. Alternatively, if the programming is entered at one of the slave units only, then only that slave unit is programmed or de-programmed.

To restrict the access to a particular transponder, the following steps should be followed.

First, the SELECT button on the receiver is depressed to flash either the satellite or the transponder display which is desired to be restricted. The antenna must be pointed at the satellite desired to be locked out, and the transponder selected (if a transponder is being locked out) that is desired to be locked out. Once the receiver and antenna are properly positioned, and either the satellite display or the transponder display is flashing, the CLEAR button is depressed on the remote, and then the STORE button is depressed on the receiver. Once the antenna is then moved, the receiver will be unable to reloate the antenna to that particular satellite, or unable to select that particular transponder on that satellite.

To de-program the restricted access, the steps are somewhat more intricate, as mentioned above. Furthermore, only one transponder at a time can be de-programmed. The sequence is as follows: first, the SELECT button is depressed on the receiver panel. Next the SATELLITE button on the remote is depressed. Then the STORE button on the receiver panel is depressed. Next, the SATELLITE button on the remote is depressed again, and then the remote may be utilized to move the antenna to the previously restricted satellite transponder. Although the previous programming restricted access to the particular transponder being de-programmed, the protocol of the first few instructions permits the receiver to request and display the previously restricted transponder. Next, the SELECT button on the receiver is depressed until the transponder display is flashing. The programming is then completed by depressing SATELLITE on the remote, STORE on the receiver, and the desired transponder from the remote. This will then de-program the desired transponder and return it to the full complement of accessible transponders available for viewing at that receiver.

As mentioned above, the programming and de-programming will restrict access only at the receiver being programmed or de-programmed, except if that receiver is the master receiver. In that event, all of the other slave receivers will also be programmed or de-programmed at the same time.

There are various changes and modifications which may be made to applicant's invention as would be apparent to those skilled in the art. However, any of these changes or modifications are included in the teaching of applicant's disclosure and he intends that his invention be limited only by the scope of the claims appended hereto.

| E | STNO | ADRS | OBJECT | M | SOURCE STATEMENT | | | |
|---|---|---|---|---|---|---|---|---|
|  | 1 |  |  |  | ; |  |  |  |
|  | 2 | 0000 | D1943 |  | SET | 00H | ;TRUE FOR 1943 REMOTE |  |
|  | 3 |  |  |  | ; |  |  |  |
|  | 4 | 0021 | RUNF |  | EQU | 21H | ;UNIT ON FLAG |  |
|  | 5 | 0022 | ERTYPE |  | EQU | 22H | ;TYPE OF ERROR REG |  |
|  | 6 | 0023 | SERINC |  | EQU | 23H | ;SERIAL INPUT COUNTER |  |
|  | 7 | 0024 | SERBI |  | EQU | 24H | ;SERIAL IN BUFFER |  |
|  | 8 | 002A | SERBO |  | EQU | 2AH | ;SERIAL OUT BUFFER |  |
|  | 9 | 007C | LOWLIM |  | EQU | 7CH | ;LOWER LIMIT REG |  |
|  | 10 | 0078 | UPLIM |  | EQU | 78H | ;UPPER LIMIT REG |  |
|  | 11 | 003B | COUNT9 |  | EQU | 3BH | ;UTILITY COUNTER |  |
|  | 12 | 003A | LPTCNT |  | EQU | 3AH | ;LOOP COUNTER |  |
|  | 13 | 0038 | POWB |  | EQU | 38H | ;POWER ON DEBOUNCE |  |
|  | 14 | 0036 | BUFT |  | EQU | 36H | ;TEMP CHAN TEST REG |  |
|  | 15 | 0030 | ACTHT |  | EQU | 30H | ;MOTOR HEALTH COUNTERS |  |
|  | 16 | 003C | PPGR |  | EQU | 3CH | ;PPG RAM LOCATIONS |  |
|  | 17 | 0040 | COUNT3 |  | EQU | 40H | ;UTILITY COUNTER |  |
|  | 18 | 0041 | SATT |  | EQU | 41H | ;SATELLITE TYPE |  |
|  | 19 | 0042 | SATN |  | EQU | 42H | ;SATELLITE NUMBER |  |
|  | 20 | 0043 | POLINF |  | EQU | 43H | ;POL INVERT FLAG |  |
|  | 21 | 0044 | TEMPA |  | EQU | 44H | ;TEMP ACCUM HOLDING |  |
|  | 22 | 0045 | CDIR |  | EQU | 45H | ;MOTOR DIRECTION FLAG |  |
|  | 23 | 0046 | AADDR |  | EQU | 46H | ;A/D CURRENT CHANNEL |  |
|  | 24 | 0047 | ADATA |  | EQU | 47H | ;A/D CURRENT DATA |  |
|  | 25 | 0049 | SCANF |  | EQU | 49H | ;SCAN ACTIVE FLAG |  |
|  | 26 | 004A | KPRESO |  | EQU | 4AH | ;KEY INPUT |  |
|  | 27 | 004B | BOUNCE |  | EQU | 4BH | ;DE-BOUNCE COUNTER |  |
|  | 28 | 004C | KEY |  | EQU | 4CH | ;ACTIVE KEY |  |
|  | 29 | 004D | KEYF |  | EQU | 4DH | ;CURRENT CMP FLAG |  |
|  | 30 | 004E | COUNT1 |  | EQU | 4EH | ;UTILITY COUNTER |  |
|  | 31 | 004F | COUNT2 |  | EQU | 4FH | ;UTILITY COUNTER |  |
|  | 32 | 0050 | ACC |  | EQU | 50H | ;MULTIPLE PRECISION ACCUM |  |
|  | 33 | 0054 | ACHAN |  | EQU | 54H | ;AUDIO CHANNEL REG |  |
|  | 34 | 0058 | CHAN |  | EQU | 58H | ;TRANSPONDER CHANNEL |  |
|  | 35 | 0060 | BCDR |  | EQU | 60H | ;BCD OUTPUT REG |  |
|  | 36 | 0065 | COUNT4 |  | EQU | 65H | ;UTILITY COUNTER |  |
|  | 37 | 0066 | IACMD0 |  | EQU | 66H | ;IR UTIL |  |
|  | 38 | 0067 | IACMD1 |  | EQU | 67H | ;IR UTIL MS ADDRESS |  |
|  | 39 | 0068 | IACMD2 |  | EQU | 68H | ;IR UTIL LS ADDRESS |  |
|  | 40 | 0069 | COUNT5 |  | EQU | 69H | ;UTILITY COUNTER |  |
|  | 41 | 006A | AFCF |  | EQU | 6AH | ;AFC FLAG |  |
|  | 42 | 006B | POLF |  | EQU | 6BH | ;POLAFITY FLAG |  |
|  | 43 | 006C | ABWF |  | EQU | 6CH | ;AUDIO BANDWIDTH FLAG |  |
|  | 44 | 006D | SENSF |  | EQU | 6DH | ;SENSOR FLAG |  |
|  | 45 | 006E | BLINKF |  | EQU | 6EH | ;BLINK ACTIVE FLAG |  |
|  | 46 | 006F | LERFL |  | EQU | 6FH | ;LIMIT ERROR FLAG |  |
|  | 47 | 0070 | REG |  | EQU | 70H | ;WORK REG |  |
|  | 48 | 0075 | UNLOCK |  | EQU | 75H | ;UNLOCK SAT FLAG |  |
|  | 49 | 0076 | SELTIM |  | EQU | 76H | ;SELECT MODE TIMER |  |
|  | 50 | 0077 | BLINKN |  | EQU | 77H | ;BLINK POINTER |  |
|  | 51 | 0080 | STIME |  | EQU | 80H | ;SCAN DELAY TIMER |  |
|  | 52 | 0086 | BTIME |  | EQU | 86H | ;BLINK TIMER |  |
|  | 53 | 008B | SSDIR |  | EQU | 8BH | ;SAT STEP DIRECTION FLAG |  |
|  | 54 | 008C | COUNT6 |  | EQU | 8CH | ;UTILITY COUNTER |  |
|  | 55 | 008D | IRKB |  | EQU | 8DH | ;TEMP REGISTER FOR TWO KEY PRES |  |
|  | 56 | 008E | SATIP |  | EQU | 8EH | ;SAT COMMAND POINTER |  |
|  | 57 | 008F | TRIP |  | EQU | 8FH | ;TRANSPONDER COMMAND POINTER |  |
|  | 58 | 0090 | CREG |  | EQU | 90H | ;MOTOR COUNTER PRESENT POSITION |  |
|  | 59 | 0095 | TREG |  | EQU | 95H | ;SEEK TEST REG |  |
|  | 60 | 0099 | MOTIRF |  | EQU | 99H | ;MOTOR ON FLAG |  |
|  | 61 | 009B | LLSET |  | EQU | 9BH | ;LOWER LIMIT SET FLAG |  |

```
 62          009C     INTSVS   EQU    9CH       ;INT REQUEST FLAG
 63          009D     MUTEF    EQU    9DH       ;MUTE FLAG
 64          009E     AFCCA    EQU    9EH       ;AFC CORRECTION FACTOR
 65          009F     CNTOK    EQU    9FH       ;COUNTER ALIVE FLAG
 66          00A0     MTIME    EQU    0A0H      ;MOTOR FAST DELAY TIMER
 67          00A6     IRSDT    EQU    0A6H      ;IR INPUT SCAN DELAY TIMER
 68          00B0     SATTAB   EQU    0B0H      ;CURRENT SATELLITE VARIABLES
 69          00C0     IRDAT    EQU    0C0H      ;32 INPUT BITS FROM IR
 70          0000     STACK    EQU    0H        ;SET TO HIGHEST RAM (255)
 71                            ;
 72          0000              ORG    00H       ;COLD START
 73                            ;
 74 0000 10                    LAI    0         ;INIT STACK
 75 0001 57                    ST               ;CLEAR MEM
 76 0002 3F31                  TAMSP
 77 0004 314D                  CALL   MEMZER    ;ZERO DISPLAY RAM AREA
 78 0006 3369                  CALL   INTALL    ;VARIOUS VARIABLES
 79 0008 3294                  CALL   CHANI     ;SET UP CHANNEL NUMBER
 80 000A 3486                  CALL   MEMCHK    ;CHECK MEMORY FOR COLD START
 81 000C 36F7                  CALL   DEFUL     ;DEFINE UPPER LIMIT
 82 000E 2E7C                  JMP    START0
 83                            ;
 84          0010              ORG    10H       ;INT TIMER (IR) ADDRESS
 85 0010 3E9E                  PSHHL
 86 0012 3E8E                  PSHDE
 87 0014 3944                  XADR   TEMPA
 88 0016 3E0E                  LEI    0EH
 89 0018 3E17                  LLI    07H
 90 001A 2EE4                  JMP    IRHED1
 91                            ;
 92          0020              ORG    20H       ;SERIAL INPUT INTERRUPT
 93 0020 3E9E                  PSHHL
 94 0022 3E8E                  PSHDE
 95 0024 3944                  XADR   TEMPA
 96 0026 4E24                  LHLI   SERBI
 97 0028 3823                  LADR   SERINC
 98 002A 78                    RC
 99 002B 3FB7                  RAL
100 002D 2F9C                  JMP    SERIR
101                            ;
102          0030              ORG    30H
103 0030 3E9E                  PSHHL            ;MOTOR COUNTER INTERRUPT ROUTINE
104 0032 3E8E                  PSHDE
105 0034 3944                  XADR   TEMPA
106 0036 4E45                  LHLI   CDIR      ;WHAT IS CURRENT DIRECTION
107 0038 64                    SKMBT  0         ;SKIP IF F = DOWN
108 0039 BE                    JCP    INT02
109 003A 341F                  CALL   CNTDEC    ;DECREMENT COUNTER
110 003C 2040                  JMP    INT03     ;RETURN
111                            ;
112 003E 30EC         INT02:   CALL   CNTINC    ;INCREMENT COUNTER
113 0040 10           INT03:   LAI    0
114 0041 399F                  XADR   CNTOK     ;RESET COUNTER HEALTH
115 0043 10                    LAI    0
116 0044 399C                  XADR   INTSVS    ;SET DISPLAY UPDATE REQUEST
117 0046 3844                  LADR   TEMPA     ;RESTORE REGS
118 0048 3E8F                  POPDE
119 004A 3E9F                  POPHL
120 004C 3F90                  EI     0
121 004E 43                    RTPSW
122                            ;
123 004F CA           RTIME4:  LHLT   TIM4
124 0050 C9           RTIME3:  LHLT   TIM3
125 0051 C6           RTIME1:  LHLT   TIM1      ;RESET SCAN DELAY TIMER
126                            ;
127 0052 4FAB                  LDEI   TIM1T     ;RESET TABLE
128 0054 13           RTIME0:  LAI    3         ;SET UP WORD COUNTER
129 0055 3969                  XADR   COUNTS
130 0057 10                    LAI    0         ;RESET TIME OUT FLAG
131 0058 57                    ST
132 0059 58                    DLS
133 005A 3E8B         RTIM1:   TEA              ;GET LS NIBBLE OF ADDRESS
```

```
134 005C 57              ST              ;TO (HL)
135 005D 3EAB            TDA             ;NEXT SIG NIBBLE
136 005F 3F34            LAMTL           ;GET DATA TO (HL)
137 0061 3E8D            IDE             ;STEP TO NEXT DATA
138 0063 58              DLS
139 0064 00              NOP
140 0065 3C69            DDRS   COUNT5
141 0067 9A              JCP    RTIM1    ;ON EVEN BOUNDARY
142 0068 53              RT
143                 ;
144 0069 CA      DTIME4: LHLT   TIM4
145 006A C9      DTIME3: LHLT   TIM3
146 006B C7      DTIME2: LHLT   TIM2
147 006C C6      DTIME1: LHLT   TIM1     ;DECREMENT SCAN DELAY TIMER
148 006D 13              LAI    3
149 006E 3969            XADR   COUNT5
150 0070 3E9E            PSHHL           ;SAVE START LOCATION
151 0072 1F              LAI    0FH      ;TIME OUT FLAG - MAYBE
152 0073 57              ST
153 0074 58              DLS
154 0075 5F      DTIM0:  SKAEM           ;CHECK FOR ALL F'S
155 0076 2080            JMP    DTIM1
156 0078 58              DLS
157 0079 00              NOP
158 007A 3C69            DDRS   COUNT5
159 007C B5              JCP    DTIM0
160 007D 3E9F            POPHL           ;RESTORE
161 007F 53              RT
162 0080 3E9F    DTIM1:  POPHL           ;RESTORE
163 0082 10              LAI    0        ;RESET TIME OUT FLAG
164 0083 57              ST
165 0084 58              DLS
166 0085 13              LAI    3
167 0086 3969            XADR   COUNT5
168 0088 52      DTIM2:  LAM    HL       ;GET LS NIBBLE
169 0089 3E8A            TAE
170 008B 48              DES             ;SKIP FOR UNDERFLOW
171 008C 96              JCP    DTIM3    ;JUMP IF NOT UNDERFLOW
172 008D 3E8B            TEA
173 008F 57              ST              ;UPDATE MEM
174 0090 58              DLS             ;STEP TO NEXT NIBBLE
175 0091 00              NOP
176 0092 3C69            DDRS   COUNT5
177 0094 88              JCP    DTIM2    ;PROCEED
178 0095 53              RT
179 0096 3E8B    DTIM3:  TEA
180 0098 57              ST              ;UPDATE MEM
181 0099 53              RT
182                 ;
183 009A 393B    UTCR:   XADR   COUNT9   ;SAVE COPY CHARACTER
184 009C 13              LAI    3
185 009D 393B            XADR   COUNT9
186 009F 57      UTCRL:  ST
187 00A0 3E9C            DHL
188 00A2 3C3B            DDRS   COUNT9
189 00A4 9F              JCP    UTCRL
190 00A5 53              RT
191                 ;
192 00A6 C7      RTIME2: LHLT   TIM2
193 00A7 4FAF            LDEI   TIM2T
194 00A9 2054            JMP    RTIME0
195                 ;
196 00AB 00      TIM1T:  DB     0
197 00AC 00              DB     0
198 00AD 02              DB     2
199 00AE 00              DB     0
200                 ;
201 00AF 00      TIM2T:  DB     0
202 00B0 04              DB     4
203 00B1 00              DB     0
204 00B2 00              DB     0
205                 ;
```

```
206 00B3 4CE6        SERINR: ANP     6,0EH       ;SERIAL INIT ROUTINE
207 00B5 4D46                ORP     6,4H        ;CLOCK INACTIVE
208 00B7 14                  LAI     0100B       ;EXTERNAL CLOCK
209 00B8 3FEF                OP      0FH
210 00BA 3F33                SIO
211 00BC 3F92                EI      2
212 00BE 53                  RT
213                     ;
214            00C0          ORG     0C0H        ;LHLT TABLE
215                     ;
216 00C0 73        REG3:     DB      REG+3
217 00C1 53        ACC3:     DB      ACC+3
218 00C2 64        BCDR4:    DB      BCDR+4
219 00C3 57        ACHAN3:   DB      ACHAN+3
220 00C4 5B        CHAN3:    DB      CHAN+3
221 00C5 4A        KEYS:     DB      KPRES0
222 00C6 84        TIM1:     DB      STIME+4
223 00C7 A4        TIM2:     DB      MTIME+4
224 00C8 93        CREG3:    DB      CREG+3
225 00C9 8A        TIM3:     DB      BTIME+4
226 00CA AA        TIM4:     DB      IRSDT+4
227 00CB 50        ACC0:     DB      ACC
228 00CC 7B        UPLIM3:   DB      UPLIM+3
229 00CD B3        SATB3:    DB      SATTAB+3
230 00CE B7        SATB7:    DB      SATTAB+7
231                     ;
232            00D0          ORG     0D0H        ;CALT TABLE
233 00D0 93        CHD:      DET     CHLDE
234 00D1 76        MPADD:    DET     MPADR
235 00D2 6C        DIG:      DET     DIGR
236 00D3 3A        UTC:      DET     UTCR
237 00D4 4A        ADC0:     DET     ADC0R
238 00D5 4B        ADC1:     DET     ADC1R
239 00D6 4C        ADC2:     DET     ADC2R
240 00D7 4D        ADC3:     DET     ADC3R
241 00D8 4E        ADC4:     DET     ADC4R
242 00D9 4F        ADC5:     DET     ADC5R
243                     ;
244 00DA 51        SERO:     LAM     HL+         ;SERIAL OUTPUT ROUTINE
245 00DB 3F3E                TAMSIO
246 00DD 59                  ILS
247 00DE 00                  NOP
248 00DF 17                  LAI     7           ;SEND 8 BITS
249 00E0 393B                XADR    COUNT9
250 00E2 4CB6      SEROL:    ANP     6,0BH       ;CLOCK = 0
251 00E4 00                  NOP
252 00E5 00                  NOP
253 00E6 4D46                ORP     6,4H        ;CLOCK = 1
254 00E8 3C3B                DDRS    COUNT9
255 00EA A2                  JCP     SEROL
256 00EB 53                  RT
257                     ;
258 00EC C8        CNTINC:   LHLT    CREG3
259 00ED C0        REGINC:   LHLT    REG3        ;INCREMENT REGISTER
260 00EE C1        ACCINC:   LHLT    ACC3        ;INCREMENT ACCUMULATOR
261 00EF 79                  SC                  ;SET CARRY TO ADD 1
262 00F0 10        ACCI0:    LAI     0
263 00F1 7C                  ACSC                ;ADD MEM TO A WITH CARRY
264 00F2 B6                  JCP     ACCI1       ;THATS ALL
265 00F3 54                  XAM     HL-         ;REPLACE A POINT TO NEXT
266 00F4 B0                  JCP     ACCI0       ;DO MORE
267 00F5 53                  RT
268 00F6 57        ACCI1:    ST
269 00F7 53                  RT
270                     ;
271 00F8 1F        RSYND:    LAI     0FH
272 00F9 396D                XADR    SENSF
273 00FB 4E05                LHLI    5
274 00FD 6B                  RMB     3
275 00FE 53                  RT
276                     ;
```

```
277           0100            ORG     100H
278                       ;
279 0100 3F           DIGTAB: DB      3FH
280 0101 06                   DB      06H
281 0102 5B                   DB      5BH
282 0103 4F                   DB      4FH
283 0104 66                   DB      66H
284 0105 6D                   DB      6DH
285 0106 7D                   DB      7DH
286 0107 27                   DB      27H
287 0108 7F                   DB      7FH
288 0109 6F                   DB      6FH
289                       ;
290 010A 10           ADC0R:  LAI     0
291 010B 11           ADC1R:  LAI     1
292 010C 12           ADC2R:  LAI     2
293 010D 13           ADC3R:  LAI     3
294 010E 14           ADC4R:  LAI     4
295 010F 15           ADC5R:  LAI     5
296                       ;
297 0110 4E46                 LHLI    AADDR
298 0112 57                   ST
299 0113 4C72                 ANP     02,7        ;TURN ON CE BAR = P2-3
300 0115 17                   LAI     7           ;SEND 8 BITS
301 0116 394E                 XADR    COUNT1
302 0118 10           ANDIG1: LAI     0           ;START WITH ZERO DATA AND CLOCK
303 0119 3FE3                 OP      3
304 011B 63                   SKMBF   3           ;LOOK AT MS BIT
305 011C 12                   LAI     2           ;TURN ON DATA
306 011D 3FE3                 OP      3           ;TO PORT
307 011F 4D43                 ORP     3,4         ;TURN ON CLOCK
308 0121 78                   RC                  ;SHIFT IN ZEROS
309 0122 52                   LAM     HL          ;GET ADDRESS
310 0123 3FB7                 RAL                 ;SHIFT TO NEXT BIT
311 0125 57                   ST                  ;AND UPDATE
312 0126 3FC6                 IP      6           ;GET INPUT DATA
313 0128 3FB7                 RAL                 ;SHIFT P6-3 TO CARRY
314 012A 3183                 CALL    SDEL0       ;UPDATE DE
315 012C 3C4E                 DDRS    COUNT1      ;CHECK COUNTER
316 012E 98                   JCP     ANDIG1
317 012F 4D82                 ORP     2,8         ;TURN OFF CE BAR
318 0131 10                   LAI     0           ;TURN OFF CLOCK
319 0132 3FE3                 OP      3
320 0134 59                   ILS
321 0135 3EAB                 TDA
322 0137 55                   XAM     HL+
323 0138 3E8B                 TEA
324 013A 57                   ST
325 013B 53                   RT
326                       ;
327 013C 10           DELS:   LAI     0
328 013D 394E                 XADR    COUNT1
329 013F 83                   JCP     DEL0
330                       ;
331 0140 14           DELAY:  LAI     04H
332 0141 394E                 XADR    COUNT1
333 0143 1F           DEL0:   LAI     0FH
334 0144 394F                 XADR    COUNT2
335 0146 3C4F         DEL1:   DDRS    COUNT2
336 0148 86                   JCP     DEL1
337 0149 3C4E                 DDRS    COUNT1
338 014B 83                   JCP     DEL0
339 014C 53                   RT
340                       ;
341 014D 1D           MEMZER: LAI     0DH
342 014E 13           DZER:   LAI     03H
343 014F 3E1F                 LLI     0FH
344 0151 4B                   XAE
345 0152 3E8B         DZER1:  TEA
346 0154 3EBA                 TAH
347 0156 10                   LAI     0
```

```
348 0157 57            DZER2:  ST
349 0158 58                    DLS
350 0159 97                    JCP     DZER2
351 015A 48                    DES
352 015B 92                    JCP     DZER1
353 015C 19                    LAI     9
354 015D 393F                  XADR    3FH             ;VOL REG
355 015F 53                    RT
356                    ;
357 0160 C8            TFRCRA: LHLT    CREG3           ;TRANSFER COUNTER REG TO ACC
358 0161 C0            TFRRA:  LHLT    REG3
359 0162 C4            TFRCA:  LHLT    CHAN3
360 0163 C3            TFRAA:  LHLT    ACHAN3
361 0164 4F53                  LDEI    ACC+3           ;POINT TO LS NIBBLE OF ACCUM
362 0166 52            TFR1:   LAM     HL              ;GET DATA
363 0167 3E9C                  DHL
364 0169 45                    XAM     DE              ;COPY
365 016A 48                    DES
366 016B A6                    JCP     TFR1            ;ON EVEN BOUNDARY
367 016C 53                    RT
368                    ;
369 016D CC            TFRULR: LHLT    UPLIM3          ;TRANSFER UPLIM TO REG
370 016E C1            TFRACR: LHLT    ACC3            ;TRANSFER ACC TO REG
371 016F C4            TFRTR:  LHLT    CHAN3           ;TRANSFER TRANS CHAN TO REG
372 0170 C3            TFRAR:  LHLT    ACHAN3          ;TRANSFER ACHAN TO REG
373 0171 4F73                  LDEI    REG+3
374 0173 52            TFR11:  LAM     HL
375 0174 3E9C                  DHL
376 0176 45                    XAM     DE
377 0177 48                    DES
378 0178 B3                    JCP     TFR11
379 0179 53                    RT
380                    ;
381 017A C8            ZCREG:  LHLT    CREG3           ;ZERO COUNTER REGISTER
382 017B C0            ZREG:   LHLT    REG3            ;ZERO REGISTER
383 017C C1            ZACC:   LHLT    ACC3            ;ZERO ACCUMULATOR
384 017D 10            ZACC1:  LAI     0
385 017E 54                    XAM     HL-
386 017F 217D                  JMP     ZACC1
387 0181 53                    RT
388                    ;
389 0182 78            SDEL:   RC                      ;RESET CARRY
390 0183 4B            SDEL0:  XAE                     ;GET LS NIBBLE
391 0184 3FB7                  RAL                     ;*2
392 0186 4B                    XAE
393 0187 4A                    XAD
394 0188 3FB7                  RAL
395 018A 4A                    XAD
396 018B 53                    RT
397                    ;
398 018C 57            DIGR:   ST
399 018D 10                    LAI     0
400 018E 3F34                  LAMTL
401 0190 3E9D                  IHL
402 0192 57                    ST
403 0193 3E9D                  IHL
404 0195 53                    RT
405                    ;
406 0196 4F73          MPADR:  LDEI    REG+3           ;GET LS NIBBLE
407 0198 C1            MPADD0: LHLT    ACC3            ;GET LS NIBBLE OF ACCUM
408 0199 78                    RC
409 019A 41            MPADD1: LAM     DE              ;GET DATA
410 019B 7C                    ACSC                    ;ADD WITH CARRY
411 019C 00                    NOP
412 019D 57                    ST                      ;PUT BACK IN ACCUM
413 019E 3E8C                  DDE
414 01A0 58                    DLS                     ;ON EVEN BOUNDARY
415 01A1 9A                    JCP     MPADD1
416 01A2 53                    RT
```

```
417
418  01A3 C1         DACCUM: LHLT    ACC3        ;DOUBLE ACCUMULATOR
419  01A4 C0         DREG:   LHLT    REG3        ;GET LS NIBBLE
420  01A5 78                 RC
421  01A6 52         DREG1:  LAM     HL          ;GET DATA
422  01A7 7C                 ACSC                ;DOUBLE
423  01A8 00                 NOP
424  01A9 57                 ST
425  01AA 58                 DLS                 ;ON EVEN BOUNDARY
426  01AB A6                 JCP     DREG1
427  01AC 53                 RT
428                  ;
429  01AD C2         BINCON: LHLT    BCDR4       ;CLEAR BCD REG
430  01AE 10                 LAI     0
431  01AF 57         BIN0:   ST
432  01B0 58                 DLS
433  01B1 AF                 JCP     BIN0
434  01B2 376F               CALL    TACRG       ;COPY ACC TO REG
435  01B4 1F                 LAI     15          ;NUMBER OF BITS IN REG LENGTH -
436  01B5 394E               XADR    COUNT1      ;STORE IN COUNTER
437  01B7 31A4      BINBCD:  CALL    DREG
438  01B9 C2                 LHLT    BCDR4       ;START WITH LS NIBBLE
439  01BA 52        BIN3:    LAM     HL
440  01BB 06                 AISC    6
441  01BC 7C                 ACSC
442  01BD 0A                 AISC    10
443  01BE 54                 XAM     HL-
444  01BF 21BA               JMP     BIN3
445  01C1 3C4E               DDRS    COUNT1
446  01C3 21B7               JMP     BINBCD
447  01C5 53                 RT
448                  ;
449  01C6 3170      AUDSET:  CALL    TFRAR       ;TRANSFER ACHAN TO REG
450  01C8 317C               CALL    ZACC        ;ZERO ACCUM
451  01CA 14                 LAI     4           ;ADD 5 TIMES FOR *5
452  01CB 394E               XADR    COUNT1      ;TO COUNTER
453  01CD D1        AUD3:    CALT    MPADD
454  01CE 3C4E               DDRS    COUNT1
455  01D0 8D                 JCP     AUD3
456  01D1 53                 RT
457                  ;
458  01D2 31C6      AUDIO:   CALL    AUDSET      ;GET CH NUM *5 IN ACCUM
459  01D4 4E70               LHLI    REG
460  01D6 11                 LAI     1           ;PUT OFFSET IN REG
461  01D7 55                 XAM     HL+         ;BYTE BY BYTE
462  01D8 15                 LAI     5
463  01D9 55                 XAM     HL+
464  01DA 17                 LAI     7
465  01DB 55                 XAM     HL+
466  01DC 1C                 LAI     0CH
467  01DD 56                 XAM     HL
468  01DE D1                 CALT    MPADD       ;ADD TO ACC
469  01DF 31AD               CALL    BINCON      ;CONVERT TO BCD
470  01E1 4E10               LHLI    10H         ;DISPLAY RAM AREA
471  01E3 3864               LADR    BCDR+4      ;POINT TO LS NIBBLE
472  01E5 D2                 CALT    DIG
473  01E6 4E0E               LHLI    0EH
474  01E8 3863               LADR    BCDR+3
475  01EA D2                 CALT    DIG
476  01EB 4E0A               LHLI    0AH
477  01ED 3862               LADR    BCDR+2
478  01EF D2                 CALT    DIG
479  01F0 4E06               LHLI    06H
480  01F2 3861               LADR    BCDR+1
481  01F4 D2                 CALT    DIG
482  01F5 4E07               LHLI    07H         ;UTILITY DISPLAY VARIABLES
483  01F7 6F                 SMB     3           ;SC
484  01F8 4E0B               LHLI    0BH
485  01FA 6F                 SMB     3           ;DP
486  01FB 4E12               LHLI    12H
487  01FD 6C                 SMB     0           ;MHZ -
488  01FE 37F6               CALL    JHOUSE      ;HANDLE AFC FLAG
489                  ;
```

```
490 0200 317C              CALL    ZACC        ;SET UP FOR SYN OUTPUT
491 0202 3170              CALL    TFRAR       ;PUT AUDIO CHANNEL IN REG
492 0204 D1                CALT    MPADD       ;NOW TO ACC
493 0205 4E70              LHLI    REG
494 0207 10                LAI     0
495 0208 55                XAM     HL+
496 0209 1C                LAI     0CH
497 020A 55                XAM     HL+
498 020B 1A                LAI     0AH
499 020C 55                XAM     HL+
500 020D 16                LAI     6
501 020E 56                XAM     HL
502 020F D1                CALT    MPADD
503 0210 3225              CALL    ASYNN
504 0212 53                RT
505               ;
506 0213 13      CHLDE:    LAI     3           ;COPY (HL) TO (DE)
507 0214 393B              XADR    COUNT9
508 0216 52      CHLDEL:   LAM     HL
509 0217 45                XAM     DE
510 0218 3E9C              DHL
511 021A 3E8C              DDE
512 021C 3C3B              DDRS    COUNT9
513 021E 96                JCP     CHLDEL
514 021F 53                RT
515               ;
516 0220 3E00    ASYNI:    LEI     0
517 0222 3E8E              PSHDE
518 0224 A9                JCP     ASYN
519               ;
520 0225 3E08    ASYNN:    LEI     8
521 0227 3E8E              PSHDE
522               ;
523 0229 3E0F    ASYN:     LEI     0FH         ;16 BITS TO SEND
524 022B 4C03              ANP     3,0         ;RESET ALL BITS
525 022D 3244              CALL    ASYN1       ;SEND BITS
526 022F 3E8F              POPDE
527 0231 3E8B              TEA                 ;SEND CONTROL WORD
528 0233 3953              XADR    ACC+3
529 0235 3E03              LEI     3           ;4 BITS MORE
530 0237 3244              CALL    ASYN1
531 0239 00                NOP
532 023A 4D13              ORP     3,1         ;LATCH HIGH - CLOCK HIGH
533 023C 00                NOP
534 023D 00                NOP
535 023E 4C63              ANP     3,6         ;LATCH LOW - CLOCK HIGH
536 0240 00                NOP
537 0241 4C03              ANP     3,0         ;ALL LOW
538 0243 53                RT
539               ;
540 0244 4C03    ASYN1:    ANP     3,0         ;RESET DATA AND CLOCK
541 0246 3253              CALL    SACC        ;SHIFT NEXT BIT INTO CARRY
542 0248 5A                SKC
543 0249 8C                JCP     ASYN2       ;DATA 0
544 024A 4D23              ORP     3,2         ;DATA 1
545 024C 00      ASYN2:    NOP
546 024D 4D43              ORP     3,4         ;TURN ON CLOCK P3-4
547 024F 00                NOP
548 0250 48                DES
549 0251 84                JCP     ASYN1       ;LOOP TILL DONE
550 0252 53                RT
551               ;
552 0253 13      SACC:     LAI     3           ;FOUR NIBBLES
553 0254 394F              XADR    COUNT2
554 0256 4E50              LHLI    ACC
555 0258 78                RC
556 0259 52      SACC1:    LAM     HL
557 025A 3FB3              RAR
558 025C 57                ST
559 025D 59                ILS
560 025E 3C4F              DDRS    COUNT2
```

```
561 0260 99                    JCP     SACC1
562 0261 53                    RT
563                  ;
564 0262 4E50     AUDIOI: LHLI  ACC     ;SET UP REG BIT BY BIT
565 0264 10               LAI   0
566 0265 55               XAM   HL+
567 0266 13               LAI   03H
568 0267 55               XAM   HL+
569 0268 11               LAI   1
570 0269 55               XAM   HL+
571 026A 1E               LAI   0EH
572 026B 55               XAM   HL+
573 026C 3220             CALL  ASYNI
574 026E 36BC     AUDI0:   CALL  ALOC
575 0270 3523             CALL  RECL1
576 0272 4E54             LHLI  ACHAN
577 0274 10               LAI   0
578 0275 55               XAM   HL+
579 0276 12               LAI   2
580 0277 394E             XADR  COUNT1
581 0279 3F70     AUDI1:   SKMEI 0       ;SEARCH FOR ALL ZEROS
582 027B 228B             JMP   AUDI2
583 027D 59               ILS
584 027E 3C4E             DDRS  COUNT1
585 0280 2279             JMP   AUDI1
586 0282 C3               LHLT  ACHAN3  ;INIT TO 6800
587 0283 14               LAI   4
588 0284 54               XAM   HL-
589 0285 10               LAI   0
590 0286 54               XAM   HL-
591 0287 11               LAI   1
592 0288 54               XAM   HL-
593 0289 10               LAI   0
594 028A 57               ST
595 028B 3051     AUDI2:   CALL  RTIME1  ;RESET SCAN DELAY TIMER
596 028D 1F               LAI   0FH     ;RESET SCAN ACTIVE FLAG
597 028E 3949             XADR  SCANF
598 0290 31D2             CALL  AUDIO
599 0292 27F6             JMP   JHOUSE
600                  ;
601 0294 C4       CHANI:   LHLT  CHAN3   ;START WITH CHANNEL 1
602 0295 11               LAI   1
603 0296 57               ST
604 0297 58               DLS
605 0298 10               LAI   0
606 0299 57               ST
607 029A 58               DLS
608 029B 57               ST
609 029C 58               DLS
610 029D 57               ST
611 029E 53               RT
612                  ;
613 029F 3162     CHANR:   CALL  TFRCA   ;COPY CHAN TO ACCUM
614 02A1 31AD             CALL  BINCON  ;CONVERT TO BCD
615 02A3 4E18             LHLI  18H     ;CHANNEL DISPLAY POSITION
616 02A5 3863             LADR  BCDR+3  ;POINT TO MS NIBBLE
617 02A7 D2               CALT  DIG
618 02A8 3864             LADR  BCDR+4
619 02AA D2               CALT  DIG
620 02AB 4E19             LHLI  19H
621 02AD 6F               SMB   3       ;TR
622 02AE 27F0             JMP   JVPGM   ;PROGRAM SYNTHESIZER
623                  ;
624 02B0 32D6     GESAT:   CALL  SEGE    ;GET SAT VAR FROM RAM
625 02B2 34DB             CALL  RAMR
626 02B4 CB               LHLT  ACC0
627 02B5 52               LAM   HL
628 02B6 3941             XADR  SATT
629 02B8 30EE             CALL  ACCINC
630 02BA 34DB             CALL  RAMR
631 02BC CB               LHLT  ACC0
632 02BD 52               LAM   HL
```

```
633 02BE 3942              XADR    SATN
634 02C0 53                RT
635                   ;
636 02C1 32D6    PUSAT:    CALL    SEGE      ;PUT SAT VAR IN RAM
637 02C3 CB                LHLT    ACC0
638 02C4 3841              LADR    SATT
639 02C6 57                ST
640 02C7 34E7              CALL    RAMW
641 02C9 30EE              CALL    ACCINC
642 02CB 3842              LADR    SATN
643 02CD CB                LHLT    ACC0
644 02CE 3842              LADR    SATN
645 02D0 57                ST
646 02D1 34E7              CALL    RAMW
647 02D3 34B8              CALL    MEMUPD
648 02D5 53                RT
649                   ;
650 02D6 C1      SEGE:     LHLT    ACC3
651 02D7 12                LAI     2
652 02D8 54                XAM     HL-
653 02D9 16                LAI     6
654 02DA 54                XAM     HL-
655 02DB 13                LAI     3
656 02DC 56                XAM     HL
657 02DD 53                RT
658                   ;
659 02DE 3E60    VSATTN:   SKDEI   0         ;QUALIFY SAT TYPE AND NUMBER
660 02E0 A2                JCP     VSAT1
661 02E1 AD                JCP     VSATE
662 02E2 3E40    VSAT1:    SKEEI   0
663 02E4 A6                JCP     VSAT2
664 02E5 AD                JCP     VSATE
665 02E6 3E8B    VSAT2:    TEA
666 02E8 7F                CMA
667 02E9 07                AISC    7
668 02EA AD                JCP     VSATE
669 02EB 79                SC
670 02EC 53                RT
671 02ED 78      VSATE:    RC
672 02EE 53                RT
673                   ;
674 02EF 3F80    RESTFX:   DI      0
675 02F1 1D                LAI     1101B
676 02F2 3FE7              OP      7
677 02F4 3847              LADR    ADATA
678 02F6 77                SKABT   3
679 02F7 1E                LAI     0EH
680 02F8 10                LAI     0
681 02F9 3FE9              OP      9
682 02FB 2FF7              JMP     RESTF0
683                   ;
684         0300            ORG     300H
685                   ;
686 0300 2544    JTBL:     JMP     TUP
687 0302 256A              JMP     TDN
688 0304 2584              JMP     AUP
689 0306 25AA              JMP     ADN
690 0308 28DF              JMP     SUP
691 030A 28F2              JMP     SDN
692 030C 2900              JMP     AFCR
693 030E 290A              JMP     BANDR
694 0310 2A1B              JMP     STEPRR
695 0312 291A              JMP     SELR
696                   ;
697 0314 4E4C    CMDP:     LHLI    KEY       ;POINT TO KEY PRESS DATA
698 0316 3F7F              SKMEI   0FH       ;SKIP IF NO PRESS
699 0318 9A                JCP     CMD1      ;OTHERWISE PROCESS DATA
700 0319 53                RT
701 031A 3877    CMD1:     LADR    BLINKN    ;CHECK IF REPEAT IS AVAILIABLE
702 031C 3F60              SKAEI   0         ;SKIP IF NOT
703 031E AD                JCP     CMD3      ;CHECK WHICH COMMAND
704 031F 1F      CMD2:     LAI     0FH       ;RESET KEY PRESS DATA
```

```
705 0320 55                XAM     HL+       ;BUT GET IT FIRST
706 0321 57      CMD2A:    ST                ;AND SAVE IN KEYF
707 0322 3E9D              IHL               ;BUMP POINTER
708 0324 78                RC                ;MULT *2
709 0325 3FB7              RAL
710 0327 57                ST                ;IN COUNT1 FOR TEMP STORAGE
711 0328 10                LAI     0         ;GET MS NIBBLE
712 0329 3FB7              RAL               ;INTO A - LS NIBBLE IN (HL)
713 032B 3F13              JAM     JTBL/256
714              ;
715 032D 3F74    CMD3:     SKMEI   4         ;IS IT SAT EAST
716 032F B2                JCP     CMD4      ;LOOK AGAIN
717 0330 51      CMD3A:    LAM     HL+       ;GET DATA BUT DO NOT RESET
718 0331 A1                JCP     CMD2A     ;THEN PROCEED AS USUAL
719 0332 3F75    CMD4:     SKMEI   5         ;IS IT SAT WEST
720 0334 9F                JCP     CMD2      ;PROCEED AS USUAL
721 0335 B0                JCP     CMD3A
722              ;
723 0336 C5      KEYBD:    LHLT    KEYS      ;POINT TO RAM TABLE
724 0337 3FC4              IP      4         ;GET DATA FROM KEYBD
725 0339 7F                CMA               ;INVERTED LOGIC
726 033A 3F6F              SKAEI   0FH       ;SKIP IF NO PRESS
727 033C 234D              JMP     KEY2      ;JMP IF PRESS
728 033E 3E9E              PSHHL             ;SAVE MEM LOCATION
729 0340 3051              CALL    RTIME1    ;RESET SCAN DELAY TIMER
730 0342 30A6              CALL    RTIME2    ;RESET MOTOR SPEED DELAY
731 0344 3E9F              POPHL
732 0346 1F                LAI     0FH
733 0347 57                ST                ;KPRES0
734 0348 59                ILS
735 0349 57      KEY0:     ST                ;BOUNCE
736 034A 59                ILS
737 034B 57      KEY1:     ST                ;KEY
738 034C 53                RT
739 034D 3949    KEY2:     XADR    SCANF     ;SAVE INPUT BEFORE
740 034F 1F                LAI     0FH       ;RESETING SCAN ACTIVE FLAG
741 0350 3949              XADR    SCANF     ;RESTORE A WITH INPUT
742 0352 5F                SKAEM             ;COMPARE WITH KPRES0
743 0353 9B                JCP     KEY3      ;JMP IF NOT SAME
744 0354 59                ILS
745 0355 3F70              SKMEI   0         ;SKIP IF BOUNCE COUNTER = 0
746 0357 9F                JCP     KEY4      ;JMP IF NOT ZERO
747 0358 306C              CALL    DTIME1    ;DECREMENT SCAN DELAY TIMER
748 035A 53                RT
749 035B 57      KEY3:     ST                ;UPDATE KPRES0
750 035C 59                ILS
751 035D 1F                LAI     0FH       ;RESET DE-BOUNCE COUNTER
752 035E 89                JCP     KEY0
753 035F 3C4B    KEY4:     DDRS    BOUNCE    ;DECREMENT DE-BOUNCE COUNTER
754 0361 3F70              SKMEI   0         ;SKIP IF DE-BOUNCE IS ZERO
755 0363 A6                JCP     KEY5      ;OTHERWISE CLEAR BUFFER
756 0364 59                ILS               ;POINT TO BUFFER
757 0365 8B                JCP     KEY1      ;AND WRITE DATA
758 0366 59      KEY5:     ILS               ;POINT TO KEY
759 0367 1F                LAI     0FH
760 0368 8B                JCP     KEY1      ;RESET BUFFER
761              ;
762 0369 1D      INTALL:   LAI     1101B     ;ENABLE EXPAN MODE
763 036A 3FE7              OP      7
764 036C 17                LAI     0111B     ;SET DISPLAY MODE
765 036D 3FEB              OP      0BH
766 036F 16                LAI     06H       ;SET DIGIT COUNTER
767 0370 3FEA              OP      0AH
768 0372 10                LAI     0         ;SET BLANKING REG
769 0373 3FE9              OP      09H
770 0375 12                LAI     2         ;SET CLOCK MODE REG
771 0376 3FEC              OP      0CH
772 0378 13                LAI     3         ;SET P6 MODE TO INPUT
773 0379 3FEE              OP      0EH
774 037B 19                LAI     9         ;ENABLE P2 FOR OUTPUT
775 037C 3FE2              OP      2
```

```
776 037E 16              LAI     6               ;ENABLE CLOCK AND PPG
777 037F 3FE8             OP      8
778 0381 15               LAI     01018           ;DISABLE EXPAN MODE
779 0382 3FE7             OP      7
780                  ;
781 0384 18               LAI     8
782 0385 399E             XADR    AFCCA           ;AFC CORECTION FACTOR
783                  ;
784 0387 3FCA             IP      0AH
785 0389 10               LAI     0
786 038A 3FEA             OP      0AH
787 038C 3FE5             OP      5               ;STANDBY - MOTOR OFF
788                  ;
789 038E 4E8E             LHLI    SATIP           ;IR KEYPRESS POINTER
790 0390 57               ST
791 0391 59               ILS                     ;KEYBD KEYPRESS POINTER
792 0392 57               ST
793 0393 59               ILS                     ;TRIP
794 0394 57               ST
795 0395 3F3F             TAMMOD                  ;INIT TIME OUT REG TO 0
796 0397 3FED             OP      0DH             ;INT1 TO RISING EDGE
797 0399 3F32             TIMER
798 039B 3FCB             IP      0BH             ;SET TO INPUT MODE
799 039D 00               NOP
800 039E 00               NOP
801                  ;
802 039F 1F               LAI     0FH
803 03A0 4E99             LHLI    MOTIRF          ;INIT BOTH MOTOR ON FLAGS
804                                               ;0FH = INACTIVE, 0 = RUN
805 03A2 57               ST                      ;IR FLAG
806 03A3 59               ILS
807 03A4 57               ST                      ;KEYBD FLAG
808 03A5 4E75             LHLI    UNLOCK
809 03A7 57               ST
810 03A8 4E9C             LHLI    INTSVS
811 03AA 57               ST
812 03AB 4E6A             LHLI    AFCF
813 03AD 57               ST                      ;AFC OFF
814 03AE 59               ILS
815 03AF 57               ST                      ;POLARITY = HORIZONTAL
816 03B0 59               ILS
817 03B1 57               ST                      ;AUDIO BANDWIDTH = WIDE
818 03B2 59               ILS
819 03B3 57               ST                      ;SENSOR OFF
820 03B4 4E9B             LHLI    LLSET
821 03B6 57               ST
822 03B7 4E6F             LHLI    LERFL
823 03B9 57               ST
824                  ;
825 03BA 3633             CALL    LDELAY
826 03BC 3F91             EI      1
827 03BE 3F94             EI      4               ;ENABLE INT1
828 03C0 3F90             EI      0               ;MASTER ENABLE
829 03C2 20B3             JMP     SERINR
830                  ;
831 03C4 13      BITGT:   LAI     3               ;4 BITS PER NIBBLE
832 03C5 3965             XADR    COUNT4
833 03C7 4F00   BITG0:    LDEI    0
834 03C9 3F32             TIMER
835 03CB 3F41   BITG1:    SKI     1               ;WAIT FOR RISING EDGE
836 03CD 9E               JCP     BITG4           ;JUMP IF ZERO
837 03CE 3EAB             TDA                     ;LOOK AT COUNTER
838 03D0 3F60             SKAEI   0               ;SKIP IF SHORT = 0
839 03D2 9C               JCP     BITG3           ;JUMP TO PROCESS 1
840 03D3 78               RC
841 03D4 52    BITG2:     LAM     HL
842 03D5 3FB3             RAR                     ;PUT CARRY IN ACCUM
843 03D7 57               ST
844 03D8 3C65             DDRS    COUNT4          ;MORE?
845 03DA 87               JCP     BITG0
846 03DB 53               RT
847 03DC 79    BITG3:     SC
```

```
848 03DD 94                   JCP     BITG2
849 03DE 3E8D     BITG4:      IDE                     ;BUMP POINTER
850 03E0 3EAB                 TDA
851 03E2 3F6F                 SKAEI   0FH             ;CHECK FOR ERROR
852 03E4 8B                   JCP     BITG1           ;WAIT SOME MORE
853 03E5 57                   ST                      ;PUT IN MEMORY
854 03E6 53                   RT
855              ;
856 03E7 4E49    CHKSCN:      LHLI    SCANF           ;CHECK SCAN ACTIVE FLAG
857 03E9 64                   SKMBT   0               ;2=SCAN UP, 4=SCAN DN, F=NO SCF
858 03EA BC                   JCP     CHKS0           ;JUMP TO SCAN
859 03EB C6                   LHLT    TIM1            ;LOAD SCAN DELAY TIMER FLAG
860 03EC 64                   SKMBT   0               ;DO NOTHING IF TIME OUT IS FALS
861 03ED 53                   RT
862 03EE 4E4D                 LHLI    KEYF            ;IS THE COMMAND AN AUDIO FUNCTI
863 03F0 12                   LAI     2               ;AUDIO UP
864 03F1 5F                   SKAEM                   ;SKIP IF IT IS
865 03F2 B6                   JCP     CHKS0A          ;TRY 3
866 03F3 3949                 XADR    SCANF           ;SET SCAN FLAG UP
867 03F5 BC                   JCP     CHKS0
868 03F6 13      CHKS0A:      LAI     3               ;AUDIO DOWN
869 03F7 5F                   SKAEM
870 03F8 53                   RT                      ;DO NOTHING
871 03F9 14                   LAI     4               ;SET SCAN FLAG DOWN
872 03FA 3949                 XADR    SCANF
873 03FC 383A    CHKS0:       LADR    LPTCNT          ;DO EVERY 16 LOOPS
874 03FE 3F60                 SKAEI   0
875 0400 53                   RT
876 0401 D4                   CALT    ADC0            ;LOOK AT AMPLITUDE OF SCAN STOP
877 0402 4E49                 LHLI    SCANF           ;WHICH DIRECTION IS SCAN
878 0404 65                   SKMBT   1               ;SKIP IF SCAN UP
879 0405 89                   JCP     CHKS1           ;JUMP TO SCAN DOWN
880 0406 3584                 CALL    AUP             ;STEP UP 1 CHANNEL
881 0408 8B                   JCP     CHKS2           ;JUMP TO STOP - MAYBE - ROUTINE
882 0409 35AA    CHKS1:       CALL    ADN             ;STEP DOWN 1 CHANNEL
883 040B D6      CHKS2:       CALT    ADC2            ;LOOK AT DISCRIMINATOR
884 040C 3140                 CALL    DELAY
885 040E 4E47                 LHLI    ADATA           ;POINT TO AMPLITUDE DATA
886 0410 63                   SKMBF   3               ;SKIP IF MSB = 0
887 0411 9C                   JCP     CHKS3
888 0412 D8                   CALT    ADC4            ;LOOK AT AFC VOLTAGE
889                                                   ;NOW DISC DATA IS IN ADATA
890 0413 4E47                 LHLI    ADATA           ;LOOK AT DISC DATA
891 0415 3F77                 SKMEI   7               ;SKIP IF DISC IS AT CENTER
892 0417 53                   RT
893 0418 1F                   LAI     0FH             ;STOP SCAN
894 0419 3949                 XADR    SCANF
895 041B 53                   RT
896 041C D8      CHKS3:       CALT    ADC4
897 041D 53                   RT
898              ;
899 041E C1      ACCDEC:      LHLT    ACC3
900 041F C8      CNTDEC:      LHLT    CREG3
901 0420 C0      REGDEC:      LHLT    REG3
902 0421 78                   RC
903 0422 1F      REGD0:       LAI     0FH
904 0423 7C                   ACSC
905 0424 00                   NOP
906 0425 54                   XAM     HL-
907 0426 A2                   JCP     REGD0
908 0427 53                   RT
909              ;
910 0428 4F93    CNTD:        LDEI    CREG+3          ;LS NIBBLE
911 042A 317C                 CALL    ZACC            ;POINT TO LS NIBBLE IN RAM
912 042C 34DB    CNTD0:       CALL    RAMR            ;GET NIBBLE
913 042E 45                   XAM     DE              ;PUT IN REG
914 042F 30EE                 CALL    ACCINC          ;BUMP MEM POINTER
915 0431 48                   DES
916 0432 AC                   JCP     CNTD0
917 0433 53                   RT
918              ;
919 0434 4F93    CNTDW:       LDEI    CREG+3          ;LS NIBBLE
```

```
920 0436 317C            CALL    ZACC       ;POINT TO LS NIBBLE IN RAM
921 0438 41     CNTDW0:  LAM     DE         ;GET DATA
922 0439 3950            XADR    ACC        ;DATA LOCATION
923 043B 34E7            CALL    RAMW       ;WRITE IT
924 043D 30EE            CALL    ACCINC
925 043F 48              DES
926 0440 2438            JMP     CNTDW0
927 0442 4F93            LDEI    CREG+3
928 0444 41     CNTDW1:  LAM     DE
929 0445 7F              CMA
930 0446 3950            XADR    ACC
931 0448 34E7            CALL    RAMW
932 044A 30EE            CALL    ACCINC
933 044C 48              DES
934 044D 84              JCP     CNTDW1
935                      ;
936 044E 386F   CNTDSP:  LADR    LERFL      ;CHECK ERROR LIMIT
937 0450 3F6F            SKAEI   0FH        ;F MEANS NO ERROR
938 0452 2A46            JMP     BB2        ;OTHERWISE BLANK DISPLAY
939 0454 3160            CALL    TFRCRA     ;MOVE CREG TO ACC
940 0456 31AD            CALL    BINCON     ;CONVERT TO BCD
941 0458 4E0C            LHLI    0CH        ;DIGIT LOCATION
942 045A 3863            LADR    BCDR+3     ;BCD REG LS NIBBLE
943 045C D2              CALT    DIG
944 045D 4E08            LHLI    08H
945 045F 3862            LADR    BCDR+2
946 0461 D2              CALT    DIG
947 0462 298E            JMP     HOUSE
948                      ;
949 0464 317C   MEMADD:  CALL    ZACC       ;START WITH ZERO RAM LOCATION
950 0466 12              LAI     2
951 0467 3952            XADR    ACC+2      ;FIRST 32 ARE FOR ACTUATOR COUN
952 0469 12              LAI     2
953 046A 3953            XADR    ACC+3      ;FIRST TWO ARE CHECKSUM
954 046C 4F00            LDEI    0          ;INIT- CHECKSUM
955 046E 34DB   MEMA0:   CALL    RAMR       ;READ DATA
956 0470 3E89            AESC               ;ADD IN CHECKSUM
957 0472 BC              JCP     MEMA1      ;JUMP IF MS NIBBLE IS OK
958 0473 3E8A            TAE                ;OTHERWISE CARRY REQUIRES WORK
959 0475 11              LAI     1          ;ADD 1 TO D TO TAKE CARE OF CAR
960 0476 3EA9            ADSC
961 0478 00              NOP                ;CARRY OK
962 0479 3EAA            TAD                ;UPDATE D
963 047B BE              JCP     MEMA2
964 047C 3E8A   MEMA1:   TAE                ;JUST UPDATE LS NIBBLE
965 047E 30EE   MEMA2:   CALL    ACCINC     ;POINT TO NEXT BYTE
966 0480 3851            LADR    ACC+1      ;CHECK FOR RAM END
967 0482 76              SKABT   2          ;A11
968 0483 246E            JMP     MEMA0
969 0485 53              RT
970                      ;
971 0486 3464   MEMCHK:  CALL    MEMADD
972 0488 317C            CALL    ZACC
973 048A 12              LAI     2
974 048B 3952            XADR    ACC+2      ;SKIP OVER ACTUATOR COUNTER
975 048D 34DB            CALL    RAMR       ;GET FIRST CHECKSUM
976 048F 4E50            LHLI    ACC        ;POINT JO DATA
977 0491 3E8B            TEA                ;GET LS NIBBLE IN A
978 0493 5F              SKAEM              ;SKIP IF THE SAME
979 0494 A0              JCP     MEMNEW     ;COLD START
980 0495 30EE            CALL    ACCINC
981 0497 34DB            CALL    RAMR       ;GET FIRST CHECKSUM
982 0499 4E50            LHLI    ACC
983 049B 3EAB            TDA                ;GET MS NIBBLE IN A
984 049D 5F              SKAEM
985 049E A0              JCP     MEMNEW
986 049F 53              RT
987                      ;
988 04A0 317C   MEMNEW:  CALL    ZACC
```

```
989  04A2 34E7    MEMN1:  CALL    RAMW
990  04A4 30EE            CALL    ACCINC
991  04A6 3851            LADR    ACC+1
992  04A8 76              SKABT   2           ;A10 = 1023 + 1
993  04A9 A2              JCP     MEMN1
994  04AA 11              LAI     1
995  04AB 3941            XADR    SATT        ;INIT STANDBY MEM SAT POS
996  04AD 11              LAI     1
997  04AE 3942            XADR    SATN
998  04B0 32C1            CALL    PUSAT
999  04B2 317A            CALL    ZCREG       ;ZERO COUNTER
1000 04B4 3434            CALL    CNTDW       ;TO SB MEM
1001 04B6 2E4C            JMP     ERRR2       ;ERROR ROUTINE
1002                   ;
1003 04B8 3464    MEMUPD: CALL    MEMADD
1004 04BA 317C            CALL    ZACC
1005 04BC 12              LAI     2
1006 04BD 3952            XADR    ACC+2       ;STEP OVER ACTUATOR VARIABLES
1007 04BF 3E8B            TEA
1008 04C1 3950            XADR    ACC
1009 04C3 34E7            CALL    RAMW
1010 04C5 30EE            CALL    ACCINC
1011 04C7 3EAB            TDA
1012 04C9 3950            XADR    ACC
1013 04CB A7              JCP     RAMW
1014                   ;
1015 04CC C1      RAMA:   LHLT    ACC3        ;ROUTINE TO SET ADDRESS
1016 04CD 50              LAM     HL-         ;FOR RAM - START WITH LS NIBBLE
1017 04CE 3FE8            OP      8           ;TO 8243
1018 04D0 50              LAM     HL-
1019 04D1 3FE9            OP      9           ;TO 8243
1020 04D3 4D1A            ORP     0AH,1       ;STROBE ADDRESS
1021 04D5 4C0A            ANP     0AH,0       ;UNSTROBE
1022 04D7 50              LAM     HL-         ;MS NIBBLE
1023 04D8 3FE9            OP      9
1024 04DA 53              RT
1025                   ;
1026 04DB 34CC    RAMR:   CALL    RAMA        ;RAM READ ROUTINE
1027 04DD 3FC8            IP      8           ;POTENTIAL TRASH
1028 04DF 4D4A            ORP     0AH,4       ;TURN ON CE
1029 04E1 3FC8            IP      8           ;SO DO AGAIN
1030 04E3 57              ST
1031 04E4 4C0A            ANP     0AH,0       ;TURN OFF ENABLE
1032 04E6 53              RT
1033                   ;
1034 04E7 34CC    RAMW:   CALL    RAMA        ;RAM WRITE ROUTINE
1035 04E9 52              LAM     HL          ;GET DATA
1036 04EA 3FE8            OP      8           ;TO 8243
1037 04EC 4DCA            ORP     0AH,0CH     ;WRITE + CE
1038 04EE 4C4A            ANP     0AH,4       ;WRITE OFF
1039 04F0 4C0A            ANP     0AH,0       ;CE OFF
1040 04F2 53              RT
1041                   ;
1042 04F3 317B    SETADD: CALL    ZREG        ;COMPUTE SB RAM ADDRESS
1043 04F5 317C            CALL    ZACC
1044 04F7 3841            LADR    SATT        ;SAT TYPE
1045 04F9 0F              AISC    0FH         ;DEC - TO GET RID OF OFFSET
1046 04FA 00              NOP
1047 04FB 3973            XADR    REG+3       ;LS NIBBLE
1048 04FD 15              LAI     5           ;*6 FOR 6 NUMBERS PER TYPE
1049 04FE 394E            XADR    COUNT1
1050 0500 D1      SETA3:  CALT    MPADD
1051 0501 3C4E            DDRS    COUNT1
1052 0503 80              JCP     SETA3
1053 0504 3842            LADR    SATN        ;ADD IN SAT NUMBER
1054 0506 0F              AISC    0FH         ;DEC
1055 0507 00              NOP
1056 0508 3973            XADR    REG+3       ;LS NIBBLE
1057 050A D1              CALT    MPADD
1058                   ;
1059 050B 316E            CALL    TFRACR      ;COPY ACC TO REG
1060 050D 317C            CALL    ZACC        ;ZERO ACCUM
```

```
1061 050F 12                    LAI     2       ;SET ACCUM TO START OF SATELLIT
PARAMETERS
1062 0510 C1                    LHLT    ACC3
1063 0511 57                    ST
1064 0512 58                    DLS
1065 0513 57                    ST
1066 0514 1D                    LAI     13      ;MULT *14
1067 0515 394E                  XADR    COUNT1
1068 0517 D1          SETA4:    CALT    MPADD
1069 0518 3C4E                  DDRS    COUNT1
1070 051A 97                    JCP     SETA4
1071 051B 1D                    LAI     13      ;SET UP FOR WHAT FOLLOWS
1072 051C 394E                  XADR    COUNT1
1073 051E 4FB0                  LDEI    SATTAB
1074 0520 53                    RT
1075                  ;
1076 0521 34F3        RECALL:   CALL    SETADD
1077 0523 34DB        RECL1:    CALL    RAMR    ;READ DATA
1078 0525 45                    XAM     DE      ;DATA IN A
1079 0526 3E8D                  IDE
1080 0528 30EE                  CALL    ACCINC  ;SET TO NEXT NIBBLE
1081 052A 3C4E                  DDRS    COUNT1
1082 052C A3                    JCP     RECL1
1083 052D 53                    RT
1084                  ;
1085 052E 34F3        STORE:    CALL    SETADD
1086 0530 41          STORE1:   LAM     DE      ;GET DATA
1087 0531 3E8D                  IDE             ;BUMP
1088 0533 3950                  XADR    ACC     ;SET TO WRITE
1089 0535 34E7                  CALL    RAMW
1090 0537 30EE                  CALL    ACCINC
1091 0539 3C4E                  DDRS    COUNT1
1092 053B B0                    JCP     STORE1
1093 053C 34B8                  CALL    MEMUPD  ;UPDATE CHECKSUM
1094 053E 371E                  CALL    CKULIM  ;POSSIBLY UPDATE UPPER LIMIT
1095 0540 5A                    SKC             ;SKIP IF UPDATEED
1096 0541 53                    RT
1097 0542 2709                  JMP     DEFUL2  ;ADD OFFSET
1098                  ;
1099 0544 3562        TUP:      CALL    GTCN
1100 0546 3E8D        TUP0:     IDE
1101 0548 3E61                  SKDEI   1
1102 054A 90                    JCP     TUP1
1103 054B 3E49                  SKEEI   9
1104 054D 90                    JCP     TUP1
1105 054E 4F01                  LDEI    1
1106 0550 37E0        TUP1:     CALL    JTLOCF
1107 0552 5A                    SKC
1108 0553 86                    JCP     TUP0
1109                  ;
1110 0554 4E5A        TRANS:    LHLI    CHAN+2
1111 0556 3EAB                  TDA             ;PUT DATA BACK
1112 0558 55                    XAM     HL+
1113 0559 3E8B                  TEA
1114 055B 57                    ST
1115 055C 329F        TRANS0:   CALL    CHANR
1116 055E 226E                  JMP     AUDI0   ;GET AUDIO VALUES
1117                  ;
1118 0560 4E42        GTTN:     LHLI    SATN    ;LOAD TYPE AND NUMBER IN DE
1119 0562 C4          GTCN:     LHLT    CHAN3
1120 0563 50                    LAM     HL-
1121 0564 3E8A                  TAE
1122 0566 52                    LAM     HL
1123 0567 3EAA                  TAD
1124 0569 53                    RT
1125                  ;
1126 056A 3562        TDN:      CALL    GTCN
1127 056C 3E8C        TDN0:     DDE             ;8 BIT DECREMENT
1128 056E 3E60                  SKDEI   0
1129 0570 B6                    JCP     TDN1
1130 0571 3E40                  SKEEI   0
1131 0573 B6                    JCP     TDN1
```

```
1132 0574 4F18              LDEI    18H        ;SET TO 18H = 24
1133 0576 37E0      TDN1:    CALL    JTLOCF
1134 0578 5A                 SKC
1135 0579 AC                 JCP     TDN0
1136 057A 94                 JCP     TRANS
1137                ;
1138 057B 317B      AUDINC:  CALL    ZREG       ;PUT OFFSET IN REG
1139 057D 11                 LAI     1
1140 057E 3973              XADR    REG+3
1141 0580 3163              CALL    TFRAA      ;COPY ACHAN TO ACCUM
1142 0582 2196              JMP     MPADR
1143                ;
1144 0584 357B      AUP:     CALL    AUDINC     ;ADD 1 TO CHANNEL NUMBER
1145 0586 4E51              LHLI    ACC+1      ;CHECK FOR OVERFLOW
1146 0588 51                 LAM     HL+
1147 0589 3F61              SKAEI   1
1148 058B 9D                 JCP     ASET
1149 058C 51                 LAM     HL+
1150 058D 3F6F              SKAEI   0FH
1151 058F 9D                 JCP     ASET
1152 0590 52                 LAM     HL
1153 0591 3F65              SKAEI   5
1154 0593 9D                 JCP     ASET
1155 0594 317C              CALL    ZACC
1156 0596 3051              CALL    RTIME1
1157 0598 304F              CALL    RTIME4
1158 059A 1F                 LAI     0FH        ;RESET SCAN ACTIVE FLAG
1159 059B 3949              XADR    SCANF
1160 059D C1       ASET:    LHLT    ACC3
1161 059E 4F57              LDEI    ACHAN+3
1162 05A0 52       ASET1:   LAM     HL         ;COPY ACCUM TO ACHAN
1163 05A1 45                 XAM     DE
1164 05A2 48                 DES
1165 05A3 58                 DLS
1166 05A4 A0                 JCP     ASET1
1167 05A5 10                 LAI     0
1168 05A6 3954              XADR    ACHAN      ;ZERO MOST SIG NIBBLE
1169 05A8 21D2              JMP     AUDIO
1170                ;
1171 05AA C0       ADN:     LHLT    REG3
1172 05AB 1F                 LAI     0FH
1173 05AC 57       ADN1:    ST
1174 05AD 58                 DLS
1175 05AE AC                 JCP     ADN1
1176 05AF 3163              CALL    TFRAA
1177 05B1 D1                 CALT    MPADD
1178 05B2 4E51              LHLI    ACC+1
1179 05B4 51                 LAM     HL+
1180 05B5 3F6F              SKAEI   0FH
1181 05B7 9D                 JCP     ASET
1182 05B8 51                 LAM     HL+
1183 05B9 3F6F              SKAEI   0FH
1184 05BB 9D                 JCP     ASET
1185 05BC 52                 LAM     HL
1186 05BD 3F6F              SKAEI   0FH
1187 05BF 259D              JMP     ASET
1188 05C1 14                 LAI     4
1189 05C2 54                 XAM     HL-
1190 05C3 1F                 LAI     0FH
1191 05C4 54                 XAM     HL-
1192 05C5 11                 LAI     1
1193 05C6 56                 XAM     HL
1194 05C7 3051              CALL    RTIME1
1195 05C9 304F              CALL    RTIME4
1196 05CB 1F                 LAI     0FH
1197 05CC 3949              XADR    SCANF
1198 05CE 259D              JMP     ASET
1199
1200                ;
1201 05D0 374B      SEEK:    CALL    CSTAB      ;CHECK SATTAB FOR ALL ZEROS
1202 05D2 5A                 SKC
```

```
1203 05D3 53                    RT                      ;JUST RETURN IF ALL ZEROS
1204 05D4 37D6                  CALL    ATSO            ;SEND INFO OUT
1205 05D6 1F                    LAI     0FH             ;RESET LIMIT ERROR FLAG
1206 05D7 396F                  XADR    LERFL
1207 05D9 37E4   SEEK2:         CALL    JREST           ;UPDATE A/D
1208 05DB 3336                  CALL    KEYBD           ;CHECK FOR HALT
1209 05DD 4E4C                  LHLI    KEY
1210 05DF 3F7F                  SKMEI   0FH
1211 05E1 2625                  JMP     SEEK8           ;RESET COMMAND AND HALT
1212 05E3 4EC8                  LHLI    IRDAT+8         ;CHECK IR
1213 05E5 3F7F                  SKMEI   0FH
1214 05E7 2619                  JMP     SEEK7           ;LOOK FOR CORRECT COMMAND
1215 05E9 4D45   SEEK2A:        ORP     5,4             ;HIGH-SPEED
1216 05EB 36D8                  CALL    CHKINT          ;UPDATE COUNTER IF NECECCARY
1217 05ED 13                    LAI     3               ;CHECK 4 NIBBLES
1218 05EE 3940                  XADR    COUNT3
1219 05F0 4EB0                  LHLI    SATTAB          ;DESIRED POSITION
1220 05F2 63                    SKMBF   3               ;CHECK FOR LOCKED OUT SAT
1221 05F3 53                    RT
1222 05F4 4F90                  LDEI    CREG            ;PRESENT POSITION
1223 05F6 41     SEEK3:         LAM     DE
1224 05F7 5F                    SKAEM                   ;SKIP IF THE SAME
1225 05F8 260C                  JMP     SEEK5           ;JUMP IF NOT THE SAME
1226 05FA 49                    IES                     ;BUMP POINTERS
1227 05FB 59                    ILS
1228 05FC 3C40                  DDRS    COUNT3
W 1229 05FE 25F6                JMP     SEEK3           ;DO MORE
1230 0600 4E45   SEEK3A:        LHLI    CDIR            ;THE SAME SO STOP MOTOR
1231 0602 64                    SKMBT   0
1232 0603 87                    JCP     SEEK4           ;JUMP IF PRESENT DIRECTION IS 0
UP
1233 0604 4C85                  ANP     5,8             ;TURN OFF AND REVERSE
1234 0606 A9                    JCP     SEEK9
1235 0607 4C85   SEEK4:         ANP     5,8             ;TURN OFF
1236 0609 4D25                  ORP     5,2             ;AND REVERSE
1237 060B A9                    JCP     SEEK9
1238 060C 4B     SEEK5:         XAE                     ;E HAS PRESENT POSITION
1239 060D 52                    LAM     HL              ;A NOW HAS DESIRED POSITION
1240 060E 3E88                  SESB                    ;IF BORROW, PRESENT LARGER THAN
ESIRED
1241 0610 95                    JCP     SEEK6           ;JUMP IF NO BORROW
1242 0611 3680                  CALL    MDN             ;BORROW SO GO UP
1243 0613 25D9                  JMP     SEEK2           ;LOOK SOME MORE
1244 0615 3664   SEEK6:         CALL    MUP             ;NO BORROW SO GO DOWN
1245 0617 25D9                  JMP     SEEK2
1246                     ;
1247 0619 4EC2   SEEK7:         LHLI    IRDAT+2
1248                     ;
1249          0000              IF      D1943
1250                            SKMEI   1H
1251                            ELSE
1252 061B 3F74                  SKMEI   4H
1253                            ENDIF
1254                     ;
1255 061D 25E9                  JMP     SEEK2A          ;NOT THE ONE
1256 061F 59                    ILS
1257 0620 3F7B                  SKMEI   0BH             ;CLEAR
1258 0622 25E9                  JMP     SEEK2A
1259 0624 80                    JCP     SEEK3A          ;HALT - THE ONE
1260                     ;
1261 0625 1F     SEEK8:         LAI     0FH
1262 0626 55                    XAM     HL+             ;RESET KEY COMMAND
1263 0627 57                    ST
1264 0628 80                    JCP     SEEK3A
1265                     ;
1266 0629 4ECA   SEEK9:         LHLI    IRDAT+0AH
1267 062B 1F                    LAI     0FH
1268 062C 57                    ST
1269 062D 58                    DLS
1270 062E 57                    ST
1271 062F 58                    DLS
1272 0630 57                    ST
```

```
1273 0631 2D1F            JMP     POLSET
1274             ;
1275 0633 3E14   LDELAY:  LLI     04H
1276 0635 3E0F   LDEL1:   LEI     0FH
1277 0637 3140   LDEL2:   CALL    DELAY
1278 0639 48              DES
1279 063A B7              JCP     LDEL2
1280 063B 58              DLS
1281 063C 2635            JMP     LDEL1
1282 063E 53              RT
1283             ;
1284 063F 4E99   CHKMO:   LHLI    MOTIRF  ;CHECK FOR MOTOR ON
1285 0641 1F              LAI     0FH     ;F MEANS NO MOVEMENT
1286 0642 5F              SKAEM
1287 0643 87              JCP     CHKMO1
1288 0644 4CA5   CHKMO0:  ANP     5,0AH   ;TURN MOTOR OFF, LOW SPEED
1289 0646 53              RT
1290 0647 56    CHKMO1:   XAM     HL      ;RESET FLAG BUT GET IT FIRST
1291 0648 3F61            SKAEI   1       ;CHECK FOR UP
1292 064A 95              JCP     CHKMO2
1293 064B 375B            CALL    CHKUL   ;CHECK IF UNDER UPPER LIMIT
1294 064D 5A              SKC
1295 064E A4              JCP     MUP
1296 064F 3877            LADR    BLINKN  ;IS POSITION SELECTED
1297 0651 3F62            SKAEI   2
1298 0653 84              JCP     CHKMO0  ;STOP MOTOR
1299 0654 A4              JCP     MUP
1300 0655 3F62   CHKMO2:  SKAEI   2       ;MEANS DOWN
1301 0657 53              RT
1302 0658 3760            CALL    CHKLL
1303 065A 5A              SKC
1304 065B 2680            JMP     MDN
1305 065D 3877            LADR    BLINKN
1306 065F 3F62            SKAEI   2
1307 0661 84              JCP     CHKMO0
1308 0662 2680            JMP     MDN
1309             ;
1310 0664 4E45   MUP:     LHLI    CDIR    ;WHAT IS CURRENT DIRECTION
1311 0666 64              SKMBT   0
1312 0667 B7              JCP     MUP1    ;JMP IF DIRECTION IS 0 = UP
1313 0668 4C85            ANP     5,8     ;TURN OFF AND REVERSE DIRECTION
1314 066A 3633            CALL    LDELAY
1315 066C 10              LAI     0       ;SET DIRECTION TO UP
1316 066D 3945            XADR    CDIR
1317 066F 30A6            CALL    RTIME2
1318 0671 12              LAI     2       ;DISABLE INT0
1319 0672 3FED            OP      0DH
1320 0674 10              LAI     0       ;RISING EDGE ACTIVE
1321 0675 3FED            OP      0DH
1322 0677 C7     MUP1:    LHLT    TIM2    ;LOOK AT TIME OUT FLAG
1323 0678 60              SKMBF   0       ;SKIP IF 0 = COUNTING
1324 0679 4D45            ORP     5,4     ;HIGH SPEED
1325 067B 4D15            ORP     5,1     ;GO
1326 067D 4CD5            ANP     5,0DH   ;UP
1327 067F 9B              JCP     MDN00
1328             ;
1329 0680 4E45   MDN:     LHLI    CDIR
1330 0682 60              SKMBF   0
1331 0683 95              JCP     MDN1
1332 0684 4C85            ANP     5,8
1333 0686 4D25            ORP     5,2
1334 0688 3633            CALL    LDELAY
1335 068A 1F              LAI     0FH     ;SET TO DOWN
1336 068B 3945            XADR    CDIR
1337 068D 30A6            CALL    RTIME2
1338 068F 12              LAI     2
1339 0690 3FED            OP      0DH
1340 0692 13              LAI     3       ;NEGATIVE EDGE TRIGGER
1341 0693 3FED            OP      0DH
1342 0695 C7     MDN1:    LHLT    TIM2
1343 0696 60              SKMBF   0
```

```
1344 0697 4D45                ORP     5,4
1345 0699 4D35                ORP     5,3     ;GO + DOWN
1346 069B 306B      MDN00:    CALL    DTIME2
1347                ;
1348 069D 3C3A                DDRS    LPTCNT
1349 069F 00                  NOP
1350                ;
1351
1352 06A0 37E6      MOTST:    CALL    JACTHE  ;MOTOR HEALTH CHECK
1353 06A2 5A                  SKC
1354 06A3 53                  RT
1355 06A4 4C85                ANP     5,8     ;TURN MOTOR OFF
1356 06A6 2E4D                JMP     ERRR1   ;ERROR RESTART
1357                ;
1358 06A8 3877      GETJMP:   LADR    BLINKN  ;GET POINTER
1359 06AA 394E                XADR    COUNT1  ;TO UTIL REG
1360 06AC 3C4E                DDRS    COUNT1  ;GET RID OF OFFSET
1361 06AE 3C4E      GETJ1:    DDRS    COUNT1
1362 06B0 B7                  JCP     GETJ2
1363 06B1 4E4E                LHLI    COUNT1
1364 06B3 4B                  XAE
1365 06B4 57                  ST
1366 06B5 4A                  XAD
1367 06B6 53                  RT
1368 06B7 3E8D      GETJ2:    IDE
1369 06B9 3E8D                IDE
1370 06BB AE                  JCP     GETJ1
1371                ;
1372 06BC 316F      ALOC:     CALL    TFRTR   ;PUT ACHAN IN REG
1373 06BE 317C                CALL    ZACC
1374 06C0 12                  LAI     2
1375 06C1 394E                XADR    COUNT1
1376 06C3 D1        ALOC1:    CALT    MPADD   ;*3
1377 06C4 3C4E                DDRS    COUNT1
1378 06C6 83                  JCP     ALOC1
1379 06C7 4E70                LHLI    REG     ;PUT OFFSET IN REG
1380 06C9 10                  LAI     0
1381 06CA 55                  XAM     HL+
1382 06CB 13                  LAI     3
1383 06CC 55                  XAM     HL+
1384 06CD 11                  LAI     1
1385 06CE 55                  XAM     HL+
1386 06CF 16                  LAI     6
1387 06D0 56                  XAM     HL
1388 06D1 D1                  CALT    MPADD
1389 06D2 12                  LAI     2
1390 06D3 394E                XADR    COUNT1
1391 06D5 4F55                LDEI    ACHAN+1
1392 06D7 53                  RT
1393                ;
1394 06D8 389C      CHKINT:   LADR    INTSVS  ;SEE IF INT HAS OCCURRED
1395 06DA 3F6F                SKAEI   0FH
1396 06DC 9E                  JCP     CHKIN1
1397 06DD 53                  RT
1398 06DE 1F        CHKIN1:   LAI     0FH
1399 06DF 399C                XADR    INTSVS
1400 06E1 2434                JMP     CNTDW   ;UPDATE DISPLAY
1401                ;
1402 06E3 78        CHKSTN:   RC              ;ROUTINE TO STEP THRU
1403 06E4 3C42                DDRS    SATN    ;SAT TYPES AND NUMBERS
1404 06E6 3842                LADR    SATN
1405 06E8 3F60                SKAEI   0
1406 06EA 53                  RT
1407 06EB 16                  LAI     6
1408 06EC 3942                XADR    SATN
1409 06EE 3C41                DDRS    SATT
1410 06F0 3841                LADR    SATT
1411 06F2 3F60                SKAEI   0
1412 06F4 53                  RT
1413 06F5 79                  SC
1414 06F6 53                  RT
```

```
1415
1416  06F7  10              DEFUL:   LAI     0
1417  06F8  4E7B                     LHLI    UPLIM+3
1418  06FA  D3                       CALT    UTC
1419                        ;
1420  06FB  4E41                     LHLI    SATT
1421  06FD  19                       LAI     9
1422  06FE  55                       XAM     HL+
1423  06FF  16                       LAI     6
1424  0700  56                       XAM     HL
1425                        ;
1426  0701  3521            DEFUL1:  CALL    RECALL
1427  0703  371E                     CALL    CKULIM
1428  0705  36E3                     CALL    CHKSTN
1429  0707  5A                       SKC
1430  0708  81                       JCP     DEFUL1
1431                        ;
1432  0709  316D            DEFUL2:  CALL    TFRULR    ;TRANSFER UPLIM TO REG
1433  070B  317C                     CALL    ZACC
1434  070D  11                       LAI     1
1435  070E  3952                     XADR    ACC+2     ;PUT 10H IN ACC
1436  0710  D1                       CALT    MPADD
1437  0711  3770                     CALL    TFRAUL    ;TRANSFER ACC TO UPLIM
1438                        ;
1439  0713  4E7F                     LHLI    LOWLIM+3
1440  0715  14                       LAI     4
1441  0716  54                       XAM     HL-
1442  0717  16                       LAI     6
1443  0718  54                       XAM     HL-
1444  0719  10                       LAI     0
1445  071A  54                       XAM     HL-
1446  071B  10                       LAI     0
1447  071C  56                       XAM     HL
1448  071D  53                       RT
1449                        ;
1450  071E  4EB0            CKULIM:  LHLI    SATTAB
1451  0720  6B                       RMB     3
1452  0721  4F78                     LDEI    UPLIM
1453  0723  372D                     CALL    CCMP
1454  0725  5A                       SKC
1455  0726  53                       RT
1456  0727  4F7B                     LDEI    UPLIM+3
1457  0729  CD                       LHLT    SATB3
1458  072A  D0              CKUL0:   CALT    CHD
1459  072B  79                       SC
1460  072C  53                       RT
1461                        ;
1462  072D  13              CCMP:    LAI     3         ;RETURN CARRY SET IF (HL)>(DE)
1463  072E  398C                     XADR    COUNT6
1464  0730  41              CCMP0:   LAM     DE
1465  0731  5F                       SKAEM             ;SKIP IF EQUAL
1466  0732  BD                       JCP     CCMP1
1467  0733  3E9D                     IHL
1468  0735  3E8D                     IDE
1469  0737  3C8C                     DDRS    COUNT6
W 1470 0739  2730                     JMP     CCMP0
1471  073B  78                       RC
1472  073C  53                       RT
1473  073D  3F60            CCMP1:   SKAEI   0
1474  073F  81                       JCP     CCMP2
1475  0740  88                       JCP     CCMP3
1476  0741  7F              CCMP2:   CMA
1477  0742  01                       AISC    1         ;FORM TWOS COMP
1478  0743  00                       NOP
1479  0744  79                       SC
1480  0745  7D                       ASC
1481  0746  78                       RC
1482  0747  53                       RT
1483  0748  79              CCMP3:   SC
1484  0749  53                       RT
1485                        ;
```

```
1486 074A CE      CPOLV:  LHLT    SATB7
1487 074B CD      CSTAB:  LHLT    SATB3           ;CHECK FOR SATTAB ALL ZERO
1488 074C 13              LAI     3
1489 074D 393B            XADR    COUNT9
1490 074F 10              LAI     0               ;IF ALL ZERO, CARRY IS
SET
1491 0750 5F      CSTAB1: SKAEM
1492 0751 99              JCP     CSTAB2
1493 0752 3E9C            DHL
1494 0754 3C3B            DDRS    COUNT9
1495 0756 90              JCP     CSTAB1
1496 0757 78              RC
1497 0758 53              RT
1498 0759 79      CSTAB2: SC
1499 075A 53              RT
1500              ;
1501 075B 4F78    CHKUL:  LDEI    UPLIM
1502 075D 4E90            LHLI    CREG
1503 075F A4              JCP     CHKLIM
1504              ;
1505 0760 4F90    CHKLL:  LDEI    CREG
1506 0762 4E7C            LHLI    LOWLIM
1507 0764 1F      CHKLIM: LAI     0FH             ;RESET LERFL
1508 0765 396F            XADR    LERFL
1509 0767 372D            CALL    CCMP
1510 0769 5A              SKC
1511 076A 53              RT
1512 076B 10              LAI     0
1513 076C 396F            XADR    LERFL
1514 076E 53              RT
1515              ;
1516 076F C0      TACRG:  LHLT    REG3            ;COPY ACCUM TO REG
1517 0770 CC      TFRAUL: LHLT    UPLIM3          ;TRANSFER ACC TO UPLIM
1518 0771 4F53            LDEI    ACC+3
1519 0773 41      T100:   LAM     DE
1520 0774 56              XAM     HL
1521 0775 3E9C            DHL
1522 0777 48              DES                     ;ACC ON EVEN BOUNDARY
1523 0778 B3              JCP     T100
1524 0779 53              RT
1525              ;
1526 077A 3823    SERIHD: LADR    SERINC
1527 077C 3F63            SKAEI   3
1528 077E 53              RT                      ;RETURN IF NOT FULL
1529 077F 10              LAI     0
1530 0780 3923            XADR    SERINC
1531 0782 4E24            LHLI    SERBI           ;POINT TO BUFFER
1532 0784 51              LAM     HL+             ;QUALIFY DATA
1533 0785 7F              CMA
1534 0786 5F              SKAEM
1535 0787 27D8            JMP     RTSO
1536 0789 59              ILS
1537 078A 51              LAM     HL+
1538 078B 7F              CMA
1539 078C 5F              SKAEM
1540 078D 27D8            JMP     RTSO
1541 078F 59              ILS
1542 0790 51              LAM     HL+
1543 0791 7F              CMA
1544 0792 5F              SKAEM
1545 0793 27D8            JMP     RTSO
1546              ;
1547 0795 4E25            LHLI    SERBI+1
1548 0797 3F73            SKMEI   3
1549 0799 A0              JCP     SERH0
1550 079A 3F82            DI      2
1551 079C 4D16            ORP     6,1
1552 079E 2F76            JMP     SOUTR0          ;RE SEND DATA
1553              ;
1554 07A0 3821    SERH0:  LADR    RUNF            ;CHECK IF UNIT IS ON
1555 07A2 3F6F            SKAEI   0FH
1556 07A4 27D3            JMP     SERH2           ;ALLOW ONLY A RESPONSE
```

```
1557
1558 07A6 3FCB         ;
1559 07A8 74                    IP      0BH        ;CHECK IF MASTER OR SLAVE
W 1560 07A9 27BF                SKABT   0          ;SKIP IF 1 = SLAVE
1561 07AB 3F71                  JMP     SERH1
1562 07AD 53                    SKMEI   1
1563 07AE 37CB                  RT
1564 07B0 32DE                  CALL    SERGD
1565 07B2 5A                    CALL    VSATTN
1566 07B3 27D8                  SKC
1567 07B5 4A                    JMP     RTSO
1568 07B6 3941                  XAD
1569 07B8 4B                    XADR    SATT
1570 07B9 3942                  XAE
1571 07BB 3521                  XADR    SATN
1572 07BD 28A3                  CALL    RECALL
1573                            JMP     DSAT
                          ;
1574 07BF 3F72         SERH1:   SKMEI   2
W 1575 07C1 27D3                JMP     SERH2
1576 07C3 3560                  CALL    GTTN
1577 07C5 3E8E                  PSHDE
1578 07C7 37CB        .         CALL    SERGD
1579 07C9 2C58                  JMP     IRNU3B
1580                      ;
1581 07CB 4E27         SERGD:   LHLI    SERBI+3
1582 07CD 51                    LAM     HL+
1583 07CE 4A                    XAD
1584 07CF 59                    ILS
1585 07D0 52                    LAM     HL
1586 07D1 4B                    XAE
1587 07D2 53                    RT
1588
1589 07D3 3F74         SERH2:   SKMEI   4          ;IF 4 SEND CURRENT INFO
1590 07D5 53                    RT
1591                      ;
1592 07D6 11           ATSO:    LAI     1
1593 07D7 12           RQSO:    LAI     2
1594 07D8 13           RTSO:    LAI     3
1595 07D9 14           IQSO:    LAI     4
1596 07DA 2F5D                  JMP     SOUTR
1597                      ;
1598 07DC 2CF8         JVSYNP:  JMP     VSYNP
1599 07DE 2ED4         JCHKPW:  JMP     CHKPW
1600 07E0 2FB0         JTLOCF:  JMP     TLOCF
1601 07E2 2B6C         JGLOC0:  JMP     GLOC0
1602 07E4 2DF1         JREST:   JMP     REST
1603 07E6 2D43         JACTHE:  JMP     ACTHE
1604 07E8 2D6C         JACTH4:  JMP     ACTH4
1605 07EA 2B6A         JGLOCA:  JMP     GLOCA
1606 07EC 28AA         JDSAT1:  JMP     DSAT1
1607 07EE 29E3         JCHKBL:  JMP     CHKBL
1608 07F0 2CAB         JVPGM:   JMP     VPGM
1609 07F2 29FE         JBSTOP:  JMP     BSTOP
1610 07F4 2852         JICMDP:  JMP     ICMDP
1611 07F6 298E         JHOUSE:  JMP     HOUSE      ;SUBROUTINE JUMPS
1612 07F8 28A3         JDSAT:   JMP     DSAT
1613 07FA 2D1F         JPOLS:   JMP     POLSET
1614 07FC 2DE4         JMUT2:   JMP     MUT2
1615                      ;
1616                      ;
1617         0800              ORG     800H
1618                      ;
1619                  ICMDPT:
1620                      ;
1621         0000              IF      D1943
1622                      ;
1623                            DB      1EH        ;AUD UP
1624                            DB      1FH        ;AUD DN
1625                            DB      00H        ;VOL UP
1626                            DB      01H        ;VOL DN
1627                            DB      1CH        ;EAST
```

```
1628                          DB      1DH     ;WEST
1629                          DB      10H     ;0
1630                          DB      11H     ;1
1631                          DB      12H     ;2
1632                          DB      13H     ;3
1633                          DB      14H     ;4
1634                          DB      15H     ;5
1635                          DB      16H     ;6
1636                          DB      17H     ;7
1637                          DB      18H     ;8
1638                          DB      19H     ;9
1639                          DB      1AH     ;SAT
1640                          DB      1BH     ;CLR
1641                          DB      08H     ;AUD BW
1642                          DB      03H     ;MUTE
1643                          DB      02H     ;POWER
1644               ;
1645                   ELSE
1646               ;
1647 0800 4E                  DB      4EH     ;AUDIO SCAN UP - BEGINS REPEATA
E CMDS
1648 0801 4F                  DB      4FH     ;AUDIO SCAN DOWN
1649 0802 00                  DB      0       ;VOL UP
1650 0803 01                  DB      1       ;VOL DOWN
1651 0804 1C                  DB      1CH     ;EAST
1652 0805 1D                  DB      1DH     ;WEST
1653 0806 40                  DB      40H     ;0
1654 0807 41                  DB      41H     ;1
1655 0808 42                  DB      42H     ;2
1656 0809 43                  DB      43H     ;3
1657 080A 44                  DB      44H     ;4
1658 080B 45                  DB      45H     ;5
1659 080C 46                  DB      46H     ;6
1660 080D 47                  DB      47H     ;7
1661 080E 48                  DB      48H     ;8
1662 080F 49                  DB      49H     ;9
1663 0810 4A                  DB      4AH     ;SAT
1664 0811 4B                  DB      4BH     ;CLEAR
1665 0812 4C                  DB      4CH     ;AUDIO BW
1666 0813 4D                  DB      4DH     ;MUTE
1667 0814 5F                  DB      5FH     ;POWER
1668               ;
1669                   ENDIF
1670               ;
1671 0815 294F      IJMPT:   JMP      IRAUP   ;IR COMMAND JUMP TABLE
1672 0817 294E               JMP      IRADN
1673 0819 2DB2               JMP      VOLDN
1674 081B 2D86               JMP      VOLUP
1675 081D 2973               JMP      IRMOTE
1676 081F 2981               JMP      IRMOTW
1677 0821 2BB8               JMP      IRNUM
1678 0823 2BB8               JMP      IRNUM
1679 0825 2BB8               JMP      IRNUM
1680 0827 2BB8               JMP      IRNUM
1681 0829 2BB8               JMP      IRNUM
1682 082B 2BB8               JMP      IRNUM
1683 082D 2BB8               JMP      IRNUM
1684 082F 2BB8               JMP      IRNUM
1685 0831 2BB8               JMP      IRNUM
1686 0833 2BB8               JMP      IRNUM
1687 0835 2B25               JMP      IRSAT
1688 0837 2B43               JMP      IRCLR
1689 0839 290A               JMP      BANDR
1690 083B 2DD2               JMP      MUTER
1691 083D 2E9A               JMP      POWOF
1692               ;
1693 083F 00                  NOP
1694 0840 7104    SATTT:      DB      71H,04H         ;F
1695 0842 3D04                DB      3DH,04H         ;G
1696 0844 3628                DB      36H,28H         ;W
1697 0846 3900                DB      39H,00H         ;C
1698 0848 7704                DB      77H,04H         ;A
```

```
1699 084A 0111             DB      01H,11H              ;T
1700 084C 6D04             DB      6DH,04H              ;S
1701 084E 3F00             DB      3FH,00H              ;O
1702 0850 BF08             DB      0BFH,08H             ;O BAR
1703                   ;
1704 0852 4EC8    ICMDP:   LHLI    IRDAT+8   ;LOOK FOR NEW COMMAND
1705 0854 3F7F             SKMEI   0FH       ;SKIP IF NOT THERE
1706 0856 A7               JCP     ICMDP1    ;JUMP TO PROCESS
1707 0857 59               ILS
1708 0858 3F70             SKMEI   0         ;LOOK FOR REPEAT FLAG
1709 085A 53               RT                ;RET IF NOT THERE
1710 085B 10               LAI     0         ;PROCESS REPEATABLE COMMAND
1711 085C 3967             XADR    IACMD1    ;MS ADDRESS
1712 085E 15               LAI     05H
1713 085F 3968             XADR    IACMD2
1714 0861 3CCA             DDRS    IRDAT+0AH            ;TIMER NIBBLE
1715 0863 AF               JCP     ICMDP2
1716 0864 1F               LAI     0FH       ;RESET REPEAT FLAG
1717 0865 57               ST
1718 0866 53               RT
1719 0867 1F    ICMDP1:    LAI     0FH       ;RESET FLAG
1720 0868 57               ST
1721 0869 11               LAI     1
1722 086A 3967             XADR    IACMD1
1723 086C 14               LAI     4
1724 086D 3968             XADR    IACMD2
1725 086F 4E66   ICMDP2:   LHLI    IACMD0    ;BUFFER
1726 0871 3868             LADR    IACMD2    ;LS NIBBLE
1727 0873 57               ST                ;IN BUFFER
1728 0874 3867             LADR    IACMD1    ;MS NIBBLE
1729 0876 3F34             LAMTL             ;GET TABLE DATA
1730 0878 4EC2             LHLI    IRDAT+2   ;POINT TO DATA IN QUESTION
1731 087A 5F               SKAEM             ;MS DATA WAS IN ACC
1732 087B 289A             JMP     IMORE     ;LOOK SOME MORE
1733 087D 3966             XADR    IACMD0    ;GET LS DATA
1734 087F 59               ILS
1735 0880 5F               SKAEM
1736 0881 9A               JCP     IMORE
1737 0882 4E68             LHLI    IACMD2    ;FORM JUMP ENTRY
1738 0884 52               LAM     HL        ;GET LS NIBBLE
1739 0885 78               RC
1740 0886 3FB7             RAL               ;*2
1741 0888 57               ST
1742 0889 58               DLS               ;POINT TO MS NIBBLE
1743 088A 52               LAM     HL        ;GET NIBBLE
1744 088B 3FB7             RAL               ;*2
1745 088D 57               ST
1746 088E 59               ILS               ;BACK TO LS NIBBLE
1747 088F 15               LAI     05        ;POINT TO START OF JUMP TABLE
1748 0890 79               SC                ;SET CARRY
1749 0891 7D               ASC
1750 0892 78               RC
1751 0893 57               ST
1752 0894 58               DLS               ;MS NIBBLE
1753 0895 11               LAI     01
1754 0896 7C               ACSC
1755 0897 59               ILS
1756 0898 3F18             JAM     8
1757                   ;
1758 089A 3C68   IMORE:    DDRS    IACMD2    ;LS NIBBLE
1759 089C 286F             JMP     ICMDP2
1760 089E 3C67             DDRS    IACMD1    ;MS NIBBLE
1761 08A0 286F             JMP     ICMDP2
1762 08A2 53               RT
1763                   ;
1764 08A3 3842   DSAT:     LADR    SATN      ;SAT NUMBER
1765 08A5 4E04             LHLI    04        ;DISP POSITION
1766 08A7 D2               CALT    DIG
1767 08A8 3841             LADR    SATT      ;SAT TYPE
1768 08AA 0F    DSAT1:     AISC    0FH       ;REMOVE BIAS
```

```
1769 08AB 00                      NOP
1770 08AC 78                      RC              ;MULT BY 2
1771 08AD 3FB7                    RAL
1772 08AF 3E8A                    TAE
1773 08B1 10                      LAI     0
1774 08B2 3FB7                    RAL
1775 08B4 04                      AISC    4       ;ADD BIAS
1776 08B5 3EAA                    TAD             ;SAVE IN DE
1777 08B7 4E00                    LHLI    0
1778 08B9 3E8B                    TEA
1779 08BB 57                      ST              ;PUT LS ADDRESS IN MEM
1780 08BC 3EAB                    TDA
1781 08BE 3F34                    LAMTL           ;GET BYTE
1782 08C0 59                      ILS
1783 08C1 57                      ST
1784 08C2 59                      ILS
1785 08C3 3E8D                    IDE
1786 08C5 3E8B                    TEA
1787 08C7 57                      ST
1788 08C8 3EAB                    TDA
1789 08CA 3F34                    LAMTL
1790 08CC 59                      ILS
1791 08CD 57                      ST
1792 08CE 374A                    CALL    CPOLV
1793 08D0 5A                      SKC
1794 08D1 96                      JCP     DSAT2
1795 08D2 37FA       DSAT3:       CALL    JPOLS
1796 08D4 22C1                    JMP     PUSAT
1797                          ;
1798 08D6 4EB4       DSAT2:       LHLI    SATTAB+4
1799 08D8 14                      LAI     04H
1800 08D9 57                      ST
1801 08DA 59                      ILS
1802 08DB 59                      ILS
1803 08DC 1C                      LAI     0CH
1804 08DD 57                      ST
1805 08DE 92                      JCP     DSAT3
1806                          ;
1807 08DF 3877       SUP:         LADR    BLINKN  ;CHECK FOR PROG MODE
1808 08E1 3F60                    SKAEI   0
1809 08E3 A9                      JCP     SUPCP
1810 08E4 10                      LAI     0
1811 08E5 398B                    XADR    SSDIR
1812 08E7 2AB6                    JMP     SATS
1813                          ;
1814 08E9 4FCF       SUPCP:       LDEI    JUMPS3 MOD 256
1815 08EB 10         SUPCP1:      LAI     0
1816 08EC 3976                    XADR    SELTIM
1817 08EE 36A8                    CALL    GETJMP
1818 08F0 3F19                    JAM     9
1819                          ;
1820 08F2 3877       SDN:         LADR    BLINKN
1821 08F4 3F60                    SKAEI   0
1822 08F6 BC                      JCP     SDNCP
1823 08F7 1F                      LAI     0FH
1824 08F8 398B                    XADR    SSDIR
1825 08FA 2AB6                    JMP     SATS
1826                          ;
1827 08FC 4FD9       SDNCP:       LDEI    JUMPS4 MOD 256
W 1828 08FE 28EB                  JMP     SUPCP1
1829                          ;
1830 0900 4E6A       AFCR:        LHLI    AFCF
1831 0902 52                      LAM     HL
1832 0903 7F                      CMA
1833 0904 57                      ST
1834 0905 18                      LAI     8
1835 0906 399E                    XADR    AFCCA
1836 0908 298E                    JMP     HOUSE
1837                          ;
1838 090A 4E6C       BANDR:       LHLI    ABWF
1839 090C 52                      LAM     HL
1840 090D 7F                      CMA
```

```
1841 090E 57              ST
1842 090F 3F6F            SKAEI   0FH         ;SKIP IF WIDE
1843 0911 96              JCP     BANDR1
1844 0912 4CD6            ANP     6,0DH       ;TURN BIT 1 OFF
1845 0914 298E            JMP     HOUSE
1846 0916 4D26    BANDR1: ORP     6,2         ;TURN BIT 1 ON
1847 0918 298E            JMP     HOUSE
1848                    ;
1849 091A 3877    SELR:   LADR    BLINKN      ;ONLY FUNCTIONS IF BLINKING
1850 091C 3F60            SKAEI   0
1851 091E A0              JCP     SELR1
1852 091F 53              RT
1853 0920 3F62    SELR1:  SKAEI   2           ;IS IT MOTOR POSITION
1854 0922 2941            JMP     SELR2
1855 0924 389B            LADR    LLSET
1856 0926 3F60            SKAEI   0
1857 0928 B3              JCP     SELR12      ;JUMP IN NO LL SET PENDING
1858 0929 317A            CALL    ZCREG       ;ZERO REG
1859 092B C8              LHLT    CREG3
1860 092C 14              LAI     04          ;SET TO 64H = 100
1861 092D 57              ST
1862 092E 58              DLS
1863 092F 16              LAI     6
1864 0930 57              ST
1865 0931 3434            CALL    CNTDW       ;WRITE TO SB MEM
1866 0933 4E93    SELR12: LHLI    CREG+3      ;PRESENT MOTOR POSITION
1867 0935 4FB3            LDEI    SATTAB+3        ;SATELLITE LOCATION
1868 0937 D0              CALT    CHD         ;COPY CREG TO SATTAB
1869 0938 1F              LAI     0FH         ;RESET LIMIT ERROR FLAG
1870 0939 396F            XADR    LERFL
1871 093B 344E            CALL    CNTDSP
1872 093D 352E            CALL    STORE
1873 093F 2A0C            JMP     CHKB3B
1874 0941 3F63    SELR2:  SKAEI   3           ;IS IT AUDIO
1875 0943 8A              JCP     SELR3
1876 0944 36BC            CALL    ALOC
1877 0946 3530            CALL    STORE1
1878 0948 2A0A            JMP     CHKB3A
1879 094A 352E    SELR3:  CALL    STORE
1880 094C 2A0A            JMP     CHKB3A
1881                    ;
1882 094E 14      IRADN:  LAI     4           ;FOR POSSIBLE SCAN DOWN
1883 094F 12      IRAUP:  LAI     2           ;FOR POSSIBLE SCAN UP
1884 0950 4B              XAE
1885 0951 4EC9            LHLI    IRDAT+9
1886 0953 3F7F            SKMEI   0FH         ;SKIP IF NEW COMMAND
1887 0955 A5              JCP     IRUP
1888 0956 3E8E            PSHDE               ;SAVE DIRECTION
1889 0958 304F            CALL    RTIME4
1890 095A 3E8F            POPDE
1891 095C 1F              LAI     0FH
1892 095D 3949            XADR    SCANF
1893 095F 3E44            SKEEI   04
1894 0961 2584            JMP     AUP
1895 0963 25AA            JMP     ADN
1896                    ;
1897 0965 3E8E    IRUP:   PSHDE
1898 0967 3069            CALL    DTIME4
1899 0969 3E8F            POPDE
1900 096B CA              LHLT    TIM4
1901 096C 64              SKMBT   0
1902 096D 53              RT
1903 096E 3E8B            TEA
1904 0970 3949            XADR    SCANF
1905 0972 53              RT
1906                    ;
1907 0973 388E    IRMOTE: LADR    SATIP
1908 0975 3F61            SKAEI   1
1909 0977 2989            JMP     IRMOT1
1910 0979 10              LAI     0
1911 097A 398B    IRMOTS: XADR    SSDIR
1912 097C 10              LAI     0
```

```
1913 097D 398E              XADR    SATIP
1914 097F 2AB6              JMP     SATS
1915                ;
1916 0981 388E      IRMOTW: LADR    SATIP
1917 0983 3F61              SKAEI   1
1918 0985 8A               JCP     IRMOT2
1919 0986 1F                LAI     0FH
1920 0987 297A              JMP     IRMOTS
1921                ;
1922 0989 11        IRMOT1: LAI     1
1923 098A 12        IRMOT2: LAI     2
1924 098B 3999              XADR    MOTIRF
1925 098D 53                RT
1926                ;
1927 098E 4F6A      HOUSE:  LDEI    AFCF
1928 0990 41                LAM     DE
1929 0991 3F6F              SKAEI   0FH
1930 0993 9B                JCP     HOUS1       ;JUMP FOR AFC ON
1931 0994 4E0D              LHLI    0DH
1932 0996 6B                RMB     3
1933 0997 4E0F              LHLI    0FH
1934 0999 6F                SMB     3
1935 099A A1                JCP     HOUS2
1936 099B 4E0D      HOUS1:  LHLI    0DH
1937 099D 6F                SMB     3
1938 099E 4E0F              LHLI    0FH
1939 09A0 6B                RMB     3
1940 09A1 49        HOUS2:  IES                 ;POINT TO POL FLAG
1941 09A2 4E12              LHLI    12H
1942 09A4 41                LAM     DE
1943 09A5 3F60              SKAEI   0
1944 09A7 AB                JCP     HOUS3       ;JUMP FOR HORI
1945 09A8 69                RMB     1
1946 09A9 6E                SMB     2
1947 09AA AD                JCP     HOUS4
1948 09AB 6A        HOUS3:  RMB     2
1949 09AC 6D                SMB     1
1950 09AD 49        HOUS4:  IES
1951 09AE 41                LAM     DE
1952 09AF 3F6F              SKAEI   0FH
1953 09B1 29B7              JMP     HOUS5       ;JUMP FOR NARROW
1954 09B3 6B                RMB     3
1955 09B4 59                ILS
1956 09B5 6C                SMB     0
1957 09B6 53                RT
1958 09B7 6F        HOUS5:  SMB     3
1959 09B8 59                ILS
1960 09B9 68                RMB     0
1961 09BA 53                RT
1962                ;
1963 09BB 28A3      JUMPS1: JMP     DSAT
1964 09BD 244E              JMP     CNTDSP
1965 09BF 2A3C              JMP     BS3
1966 09C1 298E              JMP     HOUSE
1967 09C3 229F              JMP     CHANR
1968                ;
1969 09C5 2A40      JUMPS2: JMP     BB1
1970 09C7 2A46              JMP     BB2
1971 09C9 2A54              JMP     BB3
1972 09CB 2A58              JMP     BB4
1973 09CD 2A63              JMP     BB5
1974                ;
1975 09CF 2A6E      JUMPS3: JMP     SU1
1976 09D1 2A70              JMP     SU2
1977 09D3 2A6E              JMP     SU1
1978 09D5 2A76              JMP     SU3
1979 09D7 2A6E              JMP     SU1
1980                ;
1981 09D9 2A6E      JUMPS4: JMP     SU1
1982 09DB 2A71              JMP     SD2
1983 09DD 2A6E              JMP     SU1
1984 09DF 2A94              JMP     SD3
```

```
1985 09E1 2A6E            JMP     SU1
1986                 ;
1987 09E3 3877   CHKBL:   LADR    BLINKN    ;IS A BLINK ACTIVE
1988 09E5 3F60            SKAEI   0         ;SKIP IF NOT
1989 09E7 A9              JCP     CHKB1
1990 09E8 53              RT
1991 09E9 4E8A   CHKB1:   LHLI    BTIME+4   ;0FH MEANS RESET
1992 09EB 60              SKMBF   0         ;SKIP IF NOT RESET
1993 09EC 2A07            JMP     CHKB3
1994 09EE 386E            LADR    BLINKF    ;COUNTING
1995 09F0 3F6F            SKAEI   0FH       ;SKIP IF BLINK INACTIVE
1996 09F2 29F7            JMP     CHKB2     ;JUMP TO BLINK ACTIVE ROUTINE
1997 09F4 306A            CALL    DTIME3
1998 09F6 53              RT
1999 09F7 306A   CHKB2:   CALL    DTIME3    ;JUST DEC
2000 09F9 3888            LADR    BTIME+2   ;CHECK COUNT
2001 09FB 3F61            SKAEI   1         ;SKIP IF TIME TO TURN ON DISPLA
2002 09FD 53              RT
2003                 ;
2004 09FE 1F     BSTOP:   LAI     0FH
2005 09FF 396E            XADR    BLINKF    ;BLINK FLAG FALSE
2006 0A01 4FBB            LDEI    JUMPS1 MOD 256  ;START OF JUMP TABLE
2007 0A03 36A8            CALL    GETJMP
2008 0A05 3F19            JAM     9
2009                 ;
2010 0A07 3D76   CHKB3:   IDRS    SELTIM    ;DO NOTHING TIMER
2011 0A09 90              JCP     CHKB4
2012 0A0A 37F2   CHKB3A:  CALL    JBSTOP
2013 0A0C 15     CHKB3B:  LAI     5
2014 0A0D 3977            XADR    BLINKN
2015 0A0F A1              JCP     STEPR0
2016                 ;
2017 0A10 3050   CHKB4:   CALL    RTIME3    ;BLANK DISPLAYS AGAIN
2018 0A12 10              LAI     0
2019 0A13 396E            XADR    BLINKF    ;SET FLAG TRUE
2020 0A15 4FC5            LDEI    JUMPS2 MOD 256
2021 0A17 36A8            CALL    GETJMP
2022 0A19 3F19            JAM     9
2023                 ;
2024 0A1B 3877   STEPRR:  LADR    BLINKN
2025 0A1D 3F60            SKAEI   0
2026 0A1F 37F2            CALL    JBSTOP
2027 0A21 10     STEPR0:  LAI     0         ;RESET TIMER
2028 0A22 3976            XADR    SELTIM
2029 0A24 1F              LAI     0FH       ;RESET BLINK TIMER FLAG
2030 0A25 398A            XADR    BTIME+4
2031 0A27 3D77            IDRS    BLINKN    ;INC BLINK POINTER
2032 0A29 3877            LADR    BLINKN    ;CHECK FOR OVERFLOW
2033 0A2B 3F66            SKAEI   6
2034 0A2D B2              JCP     STEPR1
2035 0A2E 10              LAI     0
2036 0A2F 3977            XADR    BLINKN
2037 0A31 B5              JCP     STEPR2
2038 0A32 1F     STEPR1:  LAI     0FH
2039 0A33 3975            XADR    UNLOCK
2040 0A35 1F     STEPR2:  LAI     0FH
2041 0A36 399B            XADR    LLSET
2042 0A38 3521            CALL    RECALL
2043 0A3A 298E            JMP     HOUSE
2044                 ;
2045 0A3C 4E07   BS3:     LHLI    07H
2046 0A3E 6F              SMB     3         ;SC
2047 0A3F 53              RT
2048                 ;
2049 0A40 15     BB1:     LAI     5
2050 0A41 394E            XADR    COUNT1
2051 0A43 4E00            LHLI    0
2052 0A45 A8              JCP     BB51
2053                 ;
2054 0A46 4E08   BB2:     LHLI    08H
2055 0A48 10              LAI     0
2056 0A49 55              XAM     HL+
```

```
2057 0A4A 10              LAI    0
2058 0A4B 56              XAM    HL
2059 0A4C 4E0C            LHLI   0CH
2060 0A4E 10              LAI    0
2061 0A4F 55              XAM    HL+
2062 0A50 10              LAI    0
2063 0A51 56              XAM    HL
2064 0A52 298E            JMP    HOUSE
2065                  ;
2066 0A54 4E07   BB3:     LHLI   07H
2067 0A56 6B              RMB    3
2068 0A57 53              RT
2069                  ;
2070 0A58 4E12   BB4:     LHLI   12H
2071 0A5A 386B            LADR   POLF
2072 0A5C 3F60            SKAEI  0         ;SKIP FOR VERT
2073 0A5E A1              JCP    BB41
2074 0A5F 6A              RMB    2
2075 0A60 53              RT
2076 0A61 69     BB41:    RMB    1
2077 0A62 53              RT
2078                  ;
2079 0A63 13     BB5:     LAI    3
2080 0A64 394E            XADR   COUNT1
2081 0A66 4E18            LHLI   18H
2082 0A68 10     BB51:    LAI    0
2083 0A69 55              XAM    HL+
2084 0A6A 3C4E            DDRS   COUNT1
2085 0A6C A8              JCP    BB51
2086 0A6D 53              RT
2087                  ;
2088 0A6E 00     SU1:     NOP
2089 0A6F 53              RT
2090                  ;
2091 0A70 11     SU2:     LAI    1         ;UP
2092 0A71 12     SD2:     LAI    2         ;DOWN
2093 0A72 3999            XADR   MOTIRF    ;START MOTOR
2094 0A74 244E            JMP    CNTDSP
2095                  ;
2096 0A76 383A   SU3:     LADR   LPTCNT    ;DONT DO EVERY TIME
2097 0A78 3F60            SKAEI  0
2098 0A7A 53              RT
2099 0A7B 386B            LADR   POLF      ;ADJUST POLOROTOR
2100 0A7D 3F60            SKAEI  0         ;SKIP FOR VERTICAL
2101 0A7F 2A83            JMP    SU31
2102 0A81 4EB6            LHLI   0B6H
2103 0A83 4EB4   SU31:    LHLI   0B4H
2104 0A85 51              LAM    HL+
2105 0A86 3EAA            TAD
2106 0A88 52              LAM    HL
2107 0A89 3E8A            TAE
2108 0A8B 3E8D            IDE
2109 0A8D 3E8B   SU32:    TEA
2110 0A8F 54              XAM    HL-
2111 0A90 3EAB            TDA
2112 0A92 56              XAM    HL
2113 0A93 AB              JCP    POLOUT
2114                  ;
2115 0A94 383A   SD3:     LADR   LPTCNT
2116 0A96 3F60            SKAEI  0
2117 0A98 53              RT
2118 0A99 386B            LADR   POLF
2119 0A9B 3F60            SKAEI  0
2120 0A9D A0              JCP    SD31
2121 0A9E 4EB6            LHLI   0B6H
2122 0AA0 4EB4   SD31:    LHLI   0B4H
2123 0AA2 51              LAM    HL+
2124 0AA3 3EAA            TAD
2125 0AA5 52              LAM    HL
2126 0AA6 3E8A            TAE
2127 0AA8 3E8C            DDE
2128 0AAA 8D              JCP    SU32
```

```
2129         ;
2130 0AAB 51      POLOUT: LAM    HL+         ;HL POINTING TO MS NIBBLE
2131 0AAC 3FE9            OP     9
2132 0AAE 52              LAM    HL
2133 0AAF 3FE8            OP     8
2134 0AB1 4D2A            ORP    0AH,2       ;STROBE LATCH
2135 0AB3 4C0A            ANP    0AH,0
2136 0AB5 53              RT
2137         ;
2138 0AB6 388B    SATS:   LADR   SSDIR       ;UP OR DOWN
2139 0AB8 3F60            SKAEI  0
2140 0ABA 10              LAI    0
2141 0ABB 1F              LAI    0FH
2142 0ABC 4E98            LHLI   TREG+3
2143 0ABE D3              CALT   UTC
2144 0ABF 3560            CALL   GTTN
2145 0AC1 3E8E            PSHDE              ;SAVE CURRENT VALUES
2146 0AC3 19              LAI    09
2147 0AC4 3941            XADR   SATT
2148 0AC6 16              LAI    06
2149 0AC7 3942            XADR   SATN
2150 0AC9 3521    SATS0:  CALL   RECALL      ;GET SAT VALUES
2151 0ACB 4EB0            LHLI   SATTAB
2152 0ACD 63              SKMBF  3           ;SKIP IF NOT LOCKED OUT
2153 0ACE 2B09            JMP    SATS10
2154 0AD0 374B            CALL   CSTAB       ;CHECK FOR SATTAB = 0
2155 0AD2 5A              SKC
2156 0AD3 2B09            JMP    SATS10
2157 0AD5 388B    SATS2:  LADR   SSDIR
2158 0AD7 3F60            SKAEI  0           ;0 MEANS UP
2159 0AD9 9F              JCP    SATS2A
2160 0ADA 4F90            LDEI   CREG
2161 0ADC 4EB0            LHLI   SATTAB
2162 0ADE A3              JCP    SATS5
2163 0ADF 4FB0    SATS2A: LDEI   SATTAB
2164 0AE1 4E90            LHLI   CREG
2165 0AE3 372D    SATS5:  CALL   CCMP        ;COMPARE (HL) TO (DE)
2166 0AE5 5A              SKC                ;SKIP IF (HL) > (DE)
2167 0AE6 2B09            JMP    SATS10
2168 0AE8 13              LAI    3
2169 0AE9 398C            XADR   COUNT6
2170 0AEB 388B            LADR   SSDIR
2171 0AED 3F6F            SKAEI  0FH
2172 0AEF B5              JCP    SATS6A
2173 0AF0 4F95            LDEI   TREG
2174 0AF2 4EB0            LHLI   SATTAB
2175 0AF4 B9              JCP    SATS6
2176 0AF5 4FB0    SATS6A: LDEI   SATTAB
2177 0AF7 4E95            LHLI   TREG
2178 0AF9 372D    SATS6:  CALL   CCMP
2179 0AFB 5A              SKC
2180 0AFC 2B09            JMP    SATS10
2181         ;
2182 0AFE 3E8F    SATS8:  POPDE
2183 0B00 3560            CALL   GTTN
2184 0B02 3E8E            PSHDE              ;SAVE CURRENT VALUES
2185 0B04 4F98            LDEI   TREG+3
2186 0B06 4EB3            LHLI   SATTAB+3
2187 0B08 D0              CALT   CHD
2188 0B09 36E3    SATS10: CALL   CHKSTN
2189 0B0B 5A              SKC
2190 0B0C 2AC9            JMP    SATS0
2191 0B0E 3E8F            POPDE
2192 0B10 3EAB            TDA
2193 0B12 3941            XADR   SATT
2194 0B14 3E8B            TEA
2195 0B16 3942            XADR   SATN
2196 0B18 3FCB            IP     0BH         ;CHECK MASTER SLAVE
2197 0B1A 74              SKABT  0           ;SKIP IF SLAVE
2198 0B1B 9F              JCP    SATS11
2199 0B1C 37D7            CALL   RQSO
2200 0B1E 53              RT
```

```
2201 0B1F 3521        SATS11:  CALL    RECALL
2202 0B21 37F8                 CALL    JDSAT
2203 0B23 25D0                 JMP     SEEK
2204                  ;
2205 0B25 3877        IRSAT:   LADR    BLINKN
2206 0B27 3F60                 SKAEI   0
2207 0B29 B5                   JCP     IRSAT1
2208 0B2A 37F8                 CALL    JDSAT
2209 0B2C 11                   LAI     1
2210 0B2D 398E                 XADR    SATIP
2211 0B2F 10                   LAI     0
2212 0B30 398F                 XADR    TRIP
2213 0B32 329F                 CALL    CHANR
2214 0B34 53                   RT
2215                  ;
2216 0B35 3F61        IRSAT1:  SKAEI   1
2217 0B37 BC                   JCP     IRSAT2
2218 0B38 10                   LAI     0
2219 0B39 3975                 XADR    UNLOCK
2220 0B3B 53                   RT
2221                  ;
2222 0B3C 3F65        IRSAT2:  SKAEI   5
2223 0B3E 53                   RT
2224 0B3F 10                   LAI     0
2225 0B40 3975                 XADR    UNLOCK
2226 0B42 53                   RT
2227                  ;
2228 0B43 3877        IRCLR:   LADR    BLINKN
2229 0B45 3F60                 SKAEI   0
2230 0B47 93                   JCP     IRCLR1
2231 0B48 329F                 CALL    CHANR
2232 0B4A 37F8                 CALL    JDSAT
2233 0B4C 10                   LAI     0
2234 0B4D 398E                 XADR    SATIP
2235 0B4F 10                   LAI     0
2236 0B50 398F                 XADR    TRIP
2237 0B52 53                   RT
2238                  ;
2239 0B53 3F61        IRCLR1:  SKAEI   1
2240 0B55 9A                   JCP     IRCLR2
2241 0B56 4EB0                 LHLI    SATTAB
2242 0B58 6F                   SMB     3       ;POSSIBLE SAT LOCK OUT
2243 0B59 53                   RT
2244                  ;
2245 0B5A 3F62        IRCLR2:  SKAEI   2
2246 0B5C A1                   JCP     IRCLR3
2247 0B5D 10                   LAI     0       ;POSSIBLE LOWER LIMIT SET
2248 0B5E 399B                 XADR    LLSET
2249 0B60 53                   RT
2250                  ;
2251 0B61 3F65        IRCLR3:  SKAEI   5
2252 0B63 53                   RT
2253 0B64 37EA                 CALL    JGLOCA
2254 0B66 3FB6                 ORL
2255 0B68 57                   ST
2256 0B69 53                   RT
2257                  ;
2258 0B6A 4F5B        GLOCA:   LDEI    CHAN+3  ;FORM ENTRY INTO LOCKOUT TAB
2259 0B6C 41          GLOC0:   LAM     DE
2260 0B6D 3E9A                 TAL
2261 0B6F 48                   DES
2262 0B70 41                   LAM     DE
2263 0B71 3EBA                 TAH
2264 0B73 3E9C                 DHL
2265 0B75 49                   IES
2266 0B76 78                   RC              ;DIVIDE BY 4
2267 0B77 7A                   XAH
2268 0B78 3FB3                 RAR
2269 0B7A 7A                   XAH
2270 0B7B 7B                   XAL
2271 0B7C 3FB3                 RAR
```

```
2272 0B7E 7B                    XAL
2273                ;
2274 0B7F 7A                    XAH
2275 0B80 3FB3                  RAR
2276 0B82 7A                    XAH
2277 0B83 7B                    XAL
2278 0B84 3FB3                  RAR
2279 0B86 7B                    XAL
2280 0B87 18                    LAI     8
2281 0B88 3E99                  ALSC
2282 0B8A 3E9A                  TAL
2283 0B8C 3E3B                  LHI     0BH
2284 0B8E 3E9E                  PSHHL           ;SAVE POINTER
2285 0B90 4E4E                  LHLI    COUNT1
2286 0B92 41                    LAM     DE
2287 0B93 57                    ST
2288 0B94 6A                    RMB     2
2289 0B95 6B                    RMB     3
2290 0B96 78                    RC
2291 0B97 11                    LAI     1
2292 0B98 3C4E    GLOC1:        DDRS    COUNT1
2293 0B9A 9E                    JCP     GLOC2
2294 0B9B 3E9F                  POPHL
2295 0B9D 53                    RT
2296 0B9E 3FB7    GLOC2:        RAL
2297 0BA0 98                    JCP     GLOC1
2298                ;
2299 0BA1 4E37    TLOC:         LHLI    BUFT+1   ;TEMP STORAGE
2300 0BA3 3E8B                  TEA
2301 0BA5 54                    XAM     HL-
2302 0BA6 3EAB                  TDA
2303 0BA8 57                    ST
2304 0BA9 3E8E                  PSHDE
2305 0BAB 4F37                  LDEI    BUFT+1
2306 0BAD 37E2                  CALL    JGLOC0
2307 0BAF 3E8F                  POPDE
2308 0BB1 3FB2                  ANL
2309 0BB3 79                    SC
2310 0BB4 3F60                  SKAEI   0
2311 0BB6 78                    RC
2312 0BB7 53                    RT
2313                ;
2314 0BB8 3877    IRNUM:        LADR    BLINKN
2315 0BBA 3F60                  SKAEI   0
2316 0BBC 53                    RT
2317 0BBD 388E                  LADR    SATIP
2318 0BBF 3F60                  SKAEI   0
2319 0BC1 2C45                  JMP     IRNUM3
2320 0BC3 388F                  LADR    TRIP
2321 0BC5 3F61                  SKAEI   1
2322 0BC7 2C34                  JMP     IRNUM2
2323 0BC9 10                    LAI     0
2324 0BCA 398F                  XADR    TRIP
2325 0BCC 10                    LAI     0
2326 0BCD 4F00                  LDEI    0
2327 0BCF 3C8D    IRNUM0:       DDRS    IRKB
2328 0BD1 2C24                  JMP     IRNUM1
2329 0BD3 3E8B                  TEA
2330 0BD5 4EC3                  LHLI    IRDAT+3
2331 0BD7 79                    SC
2332 0BD8 7D                    ASC
2333 0BD9 78                    RC
2334 0BDA 4B                    XAE
2335 0BDB 10                    LAI     0
2336 0BDC 3FB7                  RAL
2337 0BDE 3EA9                  ADSC
2338 0BE0 3EAA                  TAD
2339 0BE2 3F60                  SKAEI   0        ;CHECK BOUNDS ON INPUT
2340 0BE4 2C03                  JMP     IRNU11
2341 0BE6 3E8B                  TEA
2342 0BE8 3F60                  SKAEI   0
2343 0BEA AD                    JCP     IRNU12
```

```
2344 0BEB 255C                    JMP     TRANS0
2345 0BED 3875          IRNU12:   LADR    UNLOCK
2346 0BEF 3F6F                    SKAEI   0FH
2347 0BF1 2C0E                    JMP     IRNU22
2348 0BF3 37E0                    CALL    JTLOCF
2349 0BF5 5A                      SKC
2350 0BF6 255C                    JMP     TRANS0
2351 0BF8 3EAB                    TDA
2352 0BFA 4E5A                    LHLI    CHAN+2
2353 0BFC 57                      ST
2354 0BFD 59                      ILS
2355 0BFE 3E8B                    TEA
2356 0C00 57                      ST
2357 0C01 255C                    JMP     TRANS0
2358 0C03 3F61          IRNU11:   SKAEI   1
2359 0C05 255C                    JMP     TRANS0
2360 0C07 17                      LAI     7
2361 0C08 3E89                    AESC
2362 0C0A 2BED                    JMP     IRNU12
2363 0C0C 255C                    JMP     TRANS0
2364                     ;
2365 0C0E 4E5A          IRNU22:   LHLI    CHAN+2
2366 0C10 3EAB                    TDA
2367 0C12 57                      ST
2368 0C13 59                      ILS
2369 0C14 3E8B                    TEA
2370 0C16 57                      ST
2371 0C17 1F                      LAI     0FH
2372 0C18 3975                    XADR    UNLOCK
2373 0C1A 37EA                    CALL    JGLOCA
2374 0C1C 7F                      CMA
2375 0C1D 3FB2                    ANL
2376 0C1F 57                      ST
2377 0C20 352E                    CALL    STORE     ;UPDATE MEM
2378 0C22 229F                    JMP     CHANR
2379                     ;
2380 0C24 1A            IRNUM1:   LAI     0AH
2381 0C25 79                      SC
2382 0C26 3E89                    AESC
2383 0C28 78                      RC
2384 0C29 3E8A                    TAE
2385 0C2B 10                      LAI     0
2386 0C2C 3FB7                    RAL
2387 0C2E 3EA9                    ADSC
2388 0C30 3EAA                    TAD
2389 0C32 2BCF                    JMP     IRNUM0
2390 0C34 11            IRNUM2:   LAI     1
2391 0C35 398F                    XADR    TRIP
2392 0C37 38C3                    LADR    IRDAT+3
2393 0C39 398D                    XADR    IRKB
2394 0C3B 38C3                    LADR    IRDAT+3
2395 0C3D 4E18                    LHLI    18H       ;WRITE TO DISPLAY
2396 0C3F D2                      CALT    DIG
2397 0C40 10                      LAI     0
2398 0C41 57                      ST
2399 0C42 59                      ILS
2400 0C43 57                      ST
2401 0C44 53                      RT
2402                     ;
2403 0C45 388E          IRNUM3:   LADR    SATIP
2404 0C47 3F62                    SKAEI   2
2405 0C49 2C94                    JMP     IRNUM5
2406 0C4B 10                      LAI     0
2407 0C4C 398E                    XADR    SATIP
2408 0C4E 3560                    CALL    GTTN
2409 0C50 3E8E                    PSHDE             ;SAVE CURRENT VALUES
2410 0C52 38C3                    LADR    IRDAT+3
2411 0C54 4B                      XAE
2412 0C55 388D                    LADR    IRKB
2413 0C57 4A                      XAD
2414 0C58 32DE          IRNU3B:   CALL    VSATTN    ;QUALIFY NUMBERS
2415 0C5A 5A                      SKC               ;CARRY SET IF OK
```

```
2416 0C5B A8                    JCP      IRNU3C
 417                       ;
2418 0C5C 4A                    XAD
2419 0C5D 3941                  XADR     SATT
 420 0C5F 4B                    XAE
 421 0C60 3942                  XADR     SATN
2422 0C62 3521                  CALL     RECALL
2423 0C64 4EB0                  LHLI     SATTAB
2424 0C66 63                    SKMBF    3          ;SKIP IF NOT LOCKED
2425 0C67 B4                    JCP      IRNUM4     ;JMP IF LOCKED
2426 0C68 3E8F     IRNU3C:      POPDE               ;RESTORE STACK
2427 0C6A 37F8     IRNU3A:      CALL     JDSAT
2428 0C6C 3FCB                  IP       0BH        ;CHECK MASTER SLAVE
2429 0C6E 74                    SKABT    0
2430 0C6F 25D0                  JMP      SEEK       ;NORMAL SEEK
 431 0C71 37D7                  CALL     RQSO
2432 0C73 53                    RT
2433                       ;
2434 0C74 3875     IRNUM4:      LADR     UNLOCK
2435 0C76 3F6F                  SKAEI    0FH
 436 0C78 2C8A                  JMP      IRNUM6
 437 0C7A 3E8F                  POPDE
2438 0C7C 3EAB                  TDA
2439 0C7E 3941                  XADR     SATT
2440 0C80 3E8B                  TEA
2441 0C82 3942                  XADR     SATN
2442 0C84 3521                  CALL     RECALL
2443 0C86 37D6                  CALL     ATSO       ;OUTPUT TO SLAVES
2444 0C88 28A3                  JMP      DSAT
 445 0C8A 3E8F     IRNUM6:      POPDE
2446 0C8C 1F                    LAI      0FH
2447 0C8D 3975                  XADR     UNLOCK
2448 0C8F 6B                    RMB      3
2449 0C90 352E                  CALL     STORE
2450 0C92 2C6A                  JMP      IRNU3A
 451 0C94 38C3     IRNUM5:      LADR     IRDAT+3
2452 0C96 3F60                  SKAEI    0          ;0 IS ILLEGAL
2453 0C98 9D                    JCP      IRNUM7
2454 0C99 398E                  XADR     SATIP
2455 0C9B 2C6A                  JMP      IRNU3A
 456 0C9D 398D     IRNUM7:      XADR     IRKB
2457 0C9F 10                    LAI      0
2458 0CA0 4E04                  LHLI     4
2459 0CA2 D2                    CALT     DIG
2460 0CA3 388D                  LADR     IRKB
2461 0CA5 37EC                  CALL     JDSAT1
2462 0CA7 12                    LAI      2
 463 0CA8 398E                  XADR     SATIP
2464 0CAA 53                    RT
2465                       ;
2466 0CAB C0       VPGM:        LHLT     REG3       ;SET UP STEP FACTOR
2467 0CAC 10                    LAI      0
 468 0CAD 54                    XAM      HL-        ;TWOS COMP
2469 0CAE 16                    LAI      6
2470 0CAF 54                    XAM      HL-
 471 0CB0 1F                    LAI      0FH
 472 0CB1 54                    XAM      HL-
 473 0CB2 1F                    LAI      0FH
2474 0CB3 56                    XAM      HL
2475 0CB4 C1                    LHLT     ACC3       ;INIT TO CHAN 1 + STEP FACTOR - A
 A*4
2476 0CB5 10                    LAI      0
2477 0CB6 54                    XAM      HL-
2478 0CB7 18                    LAI      08H
2479 0CB8 54                    XAM      HL-
2480 0CB9 1C                    LAI      0CH
2481 0CBA 54                    XAM      HL-
2482 0CBB 13                    LAI      3
2483 0CBC 56                    XAM      HL
 484                       ;
2485 0CBD C4                    LHLT     CHAN3      ;TR NUMBER
2486 0CBE 50                    LAM      HL-
```

```
2487 0CBF 3E8A              TAE
2488 0CC1 52                LAM     HL
2489 0CC2 3EAA              TAD
2490                ;
2491 0CC4 3E8E      VPGML:  PSHDE
2492 0CC6 D1                CALT    MPADD
2493 0CC7 3E8F              POPDE
2494 0CC9 3E8C              DDE
2495 0CCB 3EAB              TDA
2496 0CCD 3F60              SKAEI   0
2497 0CCF 84                JCP     VPGML
2498 0CD0 3E8B              TEA
2499 0CD2 3F60              SKAEI   0
2500 0CD4 84                JCP     VPGML
2501                ;
2502 0CD5 317B              CALL    ZREG
2503 0CD7 389E              LADR    AFCCA
2504 0CD9 3973              XADR    REG+3
2505 0CDB 31A4              CALL    DREG
2506 0CDD 31A4              CALL    DREG
2507 0CDF D1                CALT    MPADD
2508                ;
2509 0CE0 3E0F              LEI     0FH     ;SEND 16 BITS
2510 0CE2 4C03              ANP     3,0     ;START WITH ALL ZEROS
2511 0CE4 4D83              ORP     3,8     ;ENABLE
2512                ;
2513 0CE6 31A3      VSYNL:  CALL    DACCUM  ;GET BIT INTO CARRY
2514 0CE8 5A                SKC
2515 0CE9 AC                JCP     VSYN1
2516 0CEA 4D23              ORP     3,2     ;DATA = 1
2517 0CEC 00       VSYN1:   NOP
2518 0CED 4D43              ORP     3,4     ;CL = 1
2519 0CEF 00                NOP
2520 0CF0 4CA3              ANP     3,0AH   ;ENAB = 1, CL = 0, DATA = 0
2521 0CF2 4C83              ANP     3,8     ;ENAB = 1
2522 0CF4 48                DES
2523 0CF5 A6                JCP     VSYNL
2524 0CF6 4C03              ANP     3,0
2525                ;
2526 0CF8 C4       VSYNP:   LHLT    CHAN3   ;PROGRAM POL
2527 0CF9 60                SKMBF   0       ;SKIP IF EVEN
2528 0CFA 2D08              JMP     VSYN2   ;JUMP IP ODDS
2529 0CFC 10                LAI     0
2530 0CFD 396B              XADR    POLF    ;START WITH VERT
2531 0CFF 4E43              LHLI    POLINF
2532 0D01 60                SKMBF   0       ;SKIP IF NORMAL
2533 0D02 2D13              JMP     VSYN4
2534 0D04 1F                LAI     0FH
2535 0D05 396B              XADR    POLF
2536 0D07 95                JCP     VSYN3
2537                ;
2538 0D08 1F       VSYN2:   LAI     0FH
2539 0D09 396B              XADR    POLF    ;START WITH HORI
2540 0D0B 4E43              LHLI    POLINF
2541 0D0D 60                SKMBF   0
2542 0D0E 95                JCP     VSYN3
2543 0D0F 10                LAI     0
2544 0D10 396B              XADR    POLF
2545 0D12 93                JCP     VSYN4
2546                ;
2547 0D13 4EB6     VSYN4:   LHLI    0B6H
2548 0D15 4EB4     VSYN3:   LHLI    0B4H
2549 0D17 3E9E              PSHHL
2550 0D19 37F6              CALL    JHOUSE
2551 0D1B 3E9F              POPHL
2552 0D1D 2AAB              JMP     POLOUT
2553                ;
2554 0D1F 3841     POLSET:  LADR    SATT    ;POINT TO SAT TYPE
2555 0D21 394E              XADR    COUNT1
2556 0D23 4F36              LDEI    JUMPS5 MOD 256
2557 0D25 3C4E              DDRS    COUNT1
2558 0D27 3C4E     POLS1:   DDRS    COUNT1
```

```
2559 0D29 B3                    JCP     POLS2
2560 0D2A 4E4E                  LHLI    COUNT1
2561 0D2C 3E8B                  TEA
2562 0D2E 57                    ST
2563 0D2F 3EAB                  TDA
2564 0D31 3F1D                  JAM     JUMPS5/256
2565 0D33 3E8D         POLS2:   IDE
2566 0D35 A7                    JCP     POLS1
2567 0D36 10           JUMPS5:  LAI     0
2568 0D37 1F                    LAI     0FH
2569 0D38 1F                    LAI     0FH
2570 0D39 10                    LAI     0
2571 0D3A 1F                    LAI     0FH
2572 0D3B 10                    LAI     0
2573 0D3C 1F                    LAI     0FH
2574 0D3D 10                    LAI     0
2575 0D3E 1F                    LAI     0FH
2576 0D3F 3943                  XADR    POLINF
2577 0D41 2CF8                  JMP     VSYNP
2578                    ;
2579 0D43 389F         ACTHE:   LADR    CNTOK
2580 0D45 3F6F                  SKAEI   0FH
2581 0D47 96                    JCP     ACTH0
2582                    ;
2583 0D48 4E30                  LHLI    ACTHT
2584 0D4A 37E8                  CALL    JACTH4
2585 0D4C 5A                    SKC
2586 0D4D 9F                    JCP     ACTH2
2587 0D4E 53                    RT
2588                    ;
2589 0D4F 4E32         ACTH3:   LHLI    ACTHT+2
2590 0D51 37E8                  CALL    JACTH4
2591 0D53 5A                    SKC
2592 0D54 00                    NOP
2593 0D55 53                    RT
2594                    ;
2595 0D56 1F           ACTH0:   LAI     0FH
2596 0D57 399F                  XADR    CNTOK
2597 0D59 4E30                  LHLI    ACTHT
2598 0D5B 10                    LAI     0
2599 0D5C 57                    ST
2600 0D5D 59                    ILS
2601 0D5E 57                    ST
2602                    ;
2603 0D5F 3FCB         ACTH2:   IP      0BH
2604 0D61 7F                    CMA
2605 0D62 76                    SKABT   2
2606 0D63 8F                    JCP     ACTH3
2607 0D64 4E32                  LHLI    ACTHT+2
2608 0D66 10                    LAI     0
2609 0D67 57                    ST
2610 0D68 59                    ILS
2611 0D69 57                    ST
2612 0D6A 78                    RC
2613 0D6B 53                    RT
2614                    ;
2615 0D6C 51           ACTH4:   LAM     HL+
2616 0D6D 3EAA                  TAD
2617 0D6F 50                    LAM     HL-
2618 0D70 3E8A                  TAE
2619 0D72 3F6F                  SKAEI   0FH
2620 0D74 BC                    JCP     ACTH5
2621 0D75 3EAB                  TDA
2622 0D77 3F6F                  SKAEI   0FH
2623 0D79 BC                    JCP     ACTH5
2624 0D7A 79                    SC
2625 0D7B 53                    RT
2626 0D7C 3E8D         ACTH5:   IDE
2627 0D7E 3EAB                  TDA
2628 0D80 55                    XAM     HL+
2629 0D81 3E8B                  TEA
2630 0D83 56                    XAM     HL
```

```
2631 0D84 78                RC
2632 0D85 53                RT
2633              ;
2634              ;
2635 0D86 4E3F    VOLUP:     LHLI    PPGR+3
2636 0D88 6B                 RMB     3
2637 0D89 C1                 LHLT    ACC3
2638 0D8A 4F3C               LDEI    PPGR
2639 0D8C 41     VOL1:       LAM     DE
2640 0D8D 49                 IES
2641 0D8E 00                 NOP
2642 0D8F 54                 XAM     HL-
2643 0D90 8C                 JCP     VOL1
2644 0D91 3E10               LLI     0
2645 0D93 6A                 RMB     2
2646 0D94 6B                 RMB     3
2647              ;
2648 0D95 C1                 LHLT    ACC3
2649 0D96 3F70   VOL2:        SKMEI   0
2650 0D98 9C                 JCP     VOL3
2651 0D99 58                 DLS
2652 0D9A 96                 JCP     VOL2
2653 0D9B A5                 JCP     VOL4A
2654 0D9C 317B   VOL3:       CALL    ZREG
2655 0D9E 3420               CALL    REGDEC
2656 0DA0 4E73               LHLI    REG+3
2657 0DA2 10                 LAI     0
2658 0DA3 57                 ST
2659 0DA4 D1     VOL4:       CALT    MPADD
2660 0DA5 CB     VOL4A:      LHLT    ACC0
2661 0DA6 6F                 SMB     3
2662 0DA7 C1                 LHLT    ACC3
2663 0DA8 4F3C               LDEI    PPGR
2664 0DAA 52     VOL5:       LAM     HL
2665 0DAB 45                 XAM     DE
2666 0DAC 49                 IES
2667 0DAD 00                 NOP
2668 0DAE 58                 DLS
2669 0DAF AA                 JCP     VOL5
2670 0DB0 2DE4               JMP     MUTE
2671              ;
2672 0DB2 4E3F    VOLDN:     LHLI    PPGR+3
2673 0DB4 6B                 RMB     3
2674 0DB5 C1                 LHLT    ACC3
2675 0DB6 4F3C               LDEI    PPGR
2676 0DB8 41     VOL6:       LAM     DE
2677 0DB9 49                 IES
2678 0DBA 00                 NOP
2679 0DBB 54                 XAM     HL-
2680 0DBC B8                 JCP     VOL6
2681 0DBD 3E10               LLI     0
2682 0DBF 6E                 SMB     2
2683 0DC0 6F                 SMB     3
2684 0DC1 4E52               LHLI    ACC+2
2685 0DC3 3F7F   VOL7:       SKMEI   0FH
2686 0DC5 8A                 JCP     VOL8
2687 0DC6 58                 DLS
2688 0DC7 83                 JCP     VOL7
2689 0DC8 2DA5               JMP     VOL4A
2690 0DCA 317B   VOL8:       CALL    ZREG
2691 0DCC 4E72               LHLI    REG+2
2692 0DCE 11                 LAI     1
2693 0DCF 57                 ST
2694 0DD0 2DA4               JMP     VOL4
2695              ;
2696 0DD2 389D    MUTER:     LADR    MUTEF
2697 0DD4 3F6F               SKAEI   0FH
2698 0DD6 A4                 JCP     MUTE
2699 0DD7 10                 LAI     0
2700 0DD8 399D               XADR    MUTEF
2701 0DDA 1D                 LAI     1101B
2702 0DDB 3FE7               OP      7
```

```
2703 0DDD 15              LAI     0101B
2704 0DDE 3FE8            OP      8
2705 0DE0 15              LAI     0101B
2706 0DE1 3FE7            OP      7
2707 0DE3 53              RT
2708                    ;
2709 0DE4 1F     MUT2:    LAI     0FH
2710 0DE5 399D            XADR    MUTEF
2711 0DE7 1D              LAI     1101B
2712 0DE8 3FE7            OP      7
2713 0DEA 16              LAI     0110B
2714 0DEB 3FE8            OP      8
2715 0DED 15              LAI     0101B
2716 0DEE 3FE7            OP      7
2717 0DF0 53              RT
2718                    ;
2719 0DF1 383A   REST:    LADR    LPTCNT
2720 0DF3 3F60            SKAEI   0
2721 0DF5 53              RT
2722 0DF6 D7              CALT    ADC3        ;DIGITIZE AGC DATA
2723 0DF7 386A            LADR    AFCF
2724 0DF9 3F60            SKAEI   0
2725 0DFB 2E25            JMP     REST10
2726 0DFD 4E47            LHLI    ADATA
2727 0DFF 52              LAM     HL
2728 0E00 3EAA            TAD
2729 0E02 3F60            SKAEI   0
2730 0E04 86              JCP     REST2
2731 0E05 9C              JCP     REST6
2732 0E06 19     REST2:   LAI     9
2733 0E07 7F              CMA
2734 0E08 01              AISC    1
2735 0E09 3EA9            ADSC
2736 0E0B 97              JCP     REST5       ;NO CORRECTION THIS WAY
2737 0E0C 389E            LADR    AFCCA
2738 0E0E 3F6F            SKAEI   0FH
2739 0E10 92              JCP     REST3
2740 0E11 A5              JCP     REST10
2741 0E12 3D9E   REST3:   IDRS    AFCCA
2742 0E14 37F0   REST4:   CALL    JVPGM
2743 0E16 A5              JCP     REST10
2744 0E17 3EAB   REST5:   TDA
2745 0E19 7F              CMA
2746 0E1A 07              AISC    7
2747 0E1B A5              JCP     REST10
2748 0E1C 389E   REST6:   LADR    AFCCA
2749 0E1E 3F60            SKAEI   0
2750 0E20 A2              JCP     REST7
2751 0E21 A5              JCP     REST10
2752 0E22 3C9E   REST7:   DDRS    AFCCA
2753 0E24 94              JCP     REST4
2754 0E25 3140   REST10:  CALL    DELAY
2755 0E27 D9              CALT    ADC5
2756 0E28 317C            CALL    ZACC
2757 0E2A C1     REST11:  LHLT    ACC3
2758 0E2B 79              SC
2759 0E2C 52     REST12:  LAM     HL
2760 0E2D 3FB7            RAL
2761 0E2F 57              ST
2762 0E30 58              DLS
2763 0E31 AC              JCP     REST12
2764 0E32 3C47            DDRS    ADATA
2765 0E34 AA              JCP     REST11
2766 0E35 CB              LHLT    ACC0
2767 0E36 6F              SMB     3
2768                    ;
2769 0E37 4F14            LDEI    14H         ;LEVEL INDICATOR
2770 0E39 C1              LHLT    ACC3
2771 0E3A 52     REST13:  LAM     HL
2772 0E3B 45              XAM     DE
2773 0E3C 49              IES
2774 0E3D 58              DLS
```

```
2775 0E3E 2E3A              JMP     REST13
2776                  ;
2777 0E40 386D        REST55: LADR   SENSF
2778 0E42 3F6F              SKAEI   0FH
2779 0E44 30F8              CALL    RSYND
2780 0E46 3140              CALL    DELAY
2781 0E48 D8                CALT    ADC4
2782 0E49 22EF              JMP     RESTFX
2783                  ;
2784 0E4B 11          ERRR1:  LAI    1
2785 0E4C 12          ERRR2:  LAI    2
2786 0E4D 4E22              LHLI    ERTYPE
2787 0E4F 57                ST
2788 0E50 4E04              LHLI    04
2789 0E52 D2                CALT    DIG
2790 0E53 4ECA              LHLI    IRDAT+0AH
2791 0E55 1F                LAI     0FH
2792 0E56 57                ST
2793 0E57 59                ILS
2794 0E58 57                ST
2795 0E59 4E00              LHLI    0
2796 0E5B 19                LAI     9
2797 0E5C 55                XAM     HL+
2798 0E5D 17                LAI     7
2799 0E5E 55                XAM     HL+
2800 0E5F 14                LAI     4
2801 0E60 55                XAM     HL+
2802 0E61 10                LAI     0
2803 0E62 55                XAM     HL+
2804 0E63 4E33              LHLI    ACTHT+3
2805 0E65 10                LAI     0
2806 0E66 D3                CALT    UTC
2807                  ;
2808 0E67 4E30              LHLI    ACTHT
2809 0E69 3F31              TAMSP              ;RESET STACK POINTER
2810                  ;
2811 0E6B 30F8        ERRRL:  CALL   RSYND
2812                  ;
2813 0E6D 3336              CALL    KEYBD
2814 0E6F 384C              LADR    KEY
2815 0E71 3F68              SKAEI   08H
2816 0E73 AB                JCP     ERRRL
2817 0E74 36F7              CALL    DEFUL
2818 0E76 3822              LADR    ERTYPE
2819 0E78 3F62              SKAEI   2
2820 0E7A 2FBF              JMP     START
2821                  ;
2822 0E7C 3428        START0: CALL   CNTD       ;INIT COUNTER REG
2823 0E7E 4FB3              LDEI    SATTAB+3
2824 0E80 34DB        STRT01: CALL   RAMR
2825 0E82 45                XAM     DE
2826 0E83 30EE              CALL    ACCINC
2827 0E85 48                DES
2828 0E86 2E80              JMP     STRT01
2829 0E88 4FB3              LDEI    SATTAB+3
2830 0E8A C8                LHLT    CREG3
2831 0E8B 41          STRT02: LAM    DE
2832 0E8C 7F                CMA
2833 0E8D 5F                SKAEM
2834 0E8E 24A0              JMP     MEMNEW
2835 0E90 3E8C              DDE
2836 0E92 58                DLS
2837 0E93 8B                JCP     STRT02
2838                  ;
2839 0E94 32B0              CALL    GESAT      ;GET LAST SAT VARIABLES FROM SB M
2840 0E96 3521              CALL    RECALL     ;GET SAT VARIABLES
2841 0E98 37DC              CALL    JVSYNP
2842                  ;
2843 0E9A 314E        POWOF:  CALL   DZER
2844 0E9C 1F                LAI     0FH
```

```
2845 0E9D 3939              XADR    POWB+1
2846 0E9F 4C05              ANP     5,0
2847 0EA1 10                LAI     0
2848 0EA2 3977              XADR    BLINKN
2849                    ;
2850 0EA4 30F8      POWOL:  CALL    RSYND
2851 0EA6 37DE              CALL    JCHKPW
2852 0EA8 3140              CALL    DELAY
2853 0EAA 3839              LADR    POWB+1
2854 0EAC 3F6F              SKAEI   0FH
2855 0EAE 2EC5              JMP     POWOL1
2856                    ;
2857 0EB0 377A              CALL    SERIHD
2858                    ;
2859 0EB2 4EC8              LHLI    IRDAT+8
2860 0EB4 3F70              SKMEI   0
2861 0EB6 A4                JCP     POWOL
2862 0EB7 4EC2              LHLI    IRDAT+2
2863                    ;
2864          0000          IF      D1943
2865                    ;
2866                        SKMEI   0
2867                        JCP     POWOL
2868                        ILS
2869                        LAI     2
2870
2871                    ;   ELSE
2872                    ;
2873 0EB9 3F75              SKMEI   5
2874 0EBB A4                JCP     POWOL
2875 0EBC 59                ILS
2876 0EBD 1F                LAI     0FH
2877                    ;
2878                        ENDIF
2879                    ;
2880 0EBE 5F                SKAEM
2881 0EBF 2EA4              JMP     POWOL
2882 0EC1 4EC8              LHLI    IRDAT+8
2883 0EC3 1F                LAI     0FH     ;TURN OFF
2884 0EC4 57                ST
2885 0EC5 1F        POWOL1: LAI     0FH
2886 0EC6 3939              XADR    POWB+1
2887 0EC8 4D85              ORP     5,8
2888 0ECA 1F                LAI     0FH
2889 0ECB 3921              XADR    RUNF    ;SET POWER ON FLAG
2890 0ECD 4E00              LHLI    0
2891 0ECF 10                LAI     0
2892 0ED0 3F31              TAMSP
2893 0ED2 2FBF              JMP     START
2894                    ;
2895 0ED4 4E38      CHKPW:  LHLI    POWB
2896 0ED6 3FCB              IP      0BH
2897 0ED8 75                SKABT   1
2898 0ED9 A2                JCP     CHPW1
2899 0EDA 3F7F              SKMEI   0FH
2900 0EDC 53                RT
2901 0EDD 10                LAI     0
2902 0EDE 57        CHPW0:  ST
2903 0EDF 59                ILS
2904 0EE0 57                ST
2905 0EE1 53                RT
2906 0EE2 1F        CHPW1:  LAI     0FH
2907 0EE3 9E                JCP     CHPW0
2908                    ;
2909 0EE4 3FCB      IRHED1: IP      0BH     ;CHECK FOR LONG (9MSEC) HEADER
2910 0EE6 77                SKABT   3
2911 0EE7 2F47              JMP     IRERR   ;ERROR IF A ZERO IS FOUND
2912 0EE9 48                DES
W 2913 0EEA 2EE4            JMP     IRHED1
2914 0EEC 58                DLS
W 2915 0EED 2EE4            JMP     IRHED1
2916 0EEF 3FCB      IRHED2: IP      0BH     ;WAIT FOR ZERO
```

```
2917 0EF1 7F              CMA
2918 0EF2 77              SKABT  3
2919 0EF3 AF              JCP    IRHED2
2920 0EF4 4F00            LDEI   0          ;INIT COUNTER
2921 0EF6 3F32            TIMER             ;INIT COUNT
2922 0EF8 3F41    IRHED3: SKI    1          ;WAIT FOR ONE
2923 0EFA 2F03            JMP    IRHED4     ;JUMP IF NO INT
2924 0EFC 3EAB            TDA               ;LOOK AT COUNTER
2925 0EFE 3F61            SKAEI  1          ;SKIP IF SHORT = REPEAT
2926 0F00 2F0D            JMP    RDATIR
2927 0F02 B9              JCP    IRRPT
2928 0F03 3E8D    IRHED4: IDE               ;BUMP COUNTER
2929 0F05 3EAB            TDA               ;CHECK FOR ERROR
2930 0F07 3F6F            SKAEI  0FH
2931 0F09 2EF8            JMP    IRHED3
2932 0F0B 2F47            JMP    IRERR
2933 0F0D 4ECA    RDATIR: LHLI   IRDAT+0AH
2934 0F0F 1F              LAI    0FH        ;REPEAT TIMER MS
2935 0F10 57              ST
2936 0F11 58              DLS               ;REPEAT FLAG FALSE
2937 0F12 57              ST
2938 0F13 58              DLS
2939 0F14 10              LAI    0          ;NEW DATA FLAG TRUE
2940 0F15 57              ST
2941 0F16 58              DLS
2942 0F17 33C4    RDDAT1: CALL   BITGT
2943 0F19 58              DLS
2944 0F1A 97              JCP    RDDAT1
2945 0F1B 4EC6            LHLI   IRDAT+6
2946 0F1D 51              LAM    HL+
2947 0F1E 3F67            SKAEI  7
2948 0F20 2F47            JMP    IRERR
2949 0F22 52              LAM    HL
2950 0F23 3F66            SKAEI  6
2951 0F25 2F47            JMP    IRERR
2952              ;
2953 0F27 4FC0            LDEI   IRDAT      ;QUALIFY DATA
2954 0F29 4EC2            LHLI   IRDAT+2
2955 0F2B 41              LAM    DE         ;GET INVERSE DATA
2956 0F2C 7F              CMA
2957 0F2D 5F              SKAEM             ;SKIP IF MATCH
2958 0F2E 2F47            JMP    IRERR
2959 0F30 59              ILS               ;DO IT AGAIN
2960 0F31 49              IES
2961 0F32 41              LAM    DE
2962 0F33 7F              CMA
2963 0F34 5F              SKAEM
2964 0F35 2F47            JMP    IRERR
2965 0F37 2F40            JMP    IREND0
2966 0F39 4ECA    IRRPT:  LHLI   IRDAT+0AH
2967 0F3B 1F              LAI    0FH        ;REPEAT TIMER MS
2968 0F3C 57              ST
2969 0F3D 58              DLS
2970 0F3E 10              LAI    0          ;REPEAT FLAG TRUE
2971 0F3F 57              ST
2972 0F40 10      IREND0: LAI    0
2973 0F41 396D            XADR   SENSF
2974 0F43 4E05            LHLI   5          ;TURN ON SENSOR
2975 0F45 6F              SMB    3
2976 0F46 92              JCP    IREND
2977 0F47 12      IRERR:  LAI    2
2978 0F48 3965            XADR   COUNT4
2979 0F4A 1F              LAI    0FH
2980 0F4B 4ECA            LHLI   IRDAT+0AH
2981 0F4D 57      IRERR1: ST
2982 0F4E 58              DLS
2983 0F4F 3C65            DDRS   COUNT4
2984 0F51 8D              JCP    IRERR1
2985 0F52 3E8F    IREND:  POPDE
2986 0F54 3E9F            POPHL
2987 0F56 3944            XADR   TEMPA
2988 0F58 3F32            TIMER
```

```
2989 0F5A 3F90            EI       0
2990 0F5C 43              RTPSW
2991                   ;
2992 0F5D 3F82   SOUTR:   DI       2         ;INHIBIT INPUT
2993 0F5F 3923            XADR     SERINC
2994 0F61 10              LAI      0
2995 0F62 3923            XADR     SERINC
2996 0F64 4E2A   SOUTR1:  LHLI     SERBO     ;OUTPUT BUFFER
2997 0F66 57              ST
2998 0F67 59              ILS
2999 0F68 7F              CMA
3000 0F69 55              XAM      HL+
3001 0F6A 3841            LADR     SATT
3002 0F6C 57              ST
3003 0F6D 59              ILS
3004 0F6E 7F              CMA
3005 0F6F 55              XAM      HL+
3006 0F70 3842            LADR     SATN
3007 0F72 57              ST
3008 0F73 59              ILS
3009 0F74 7F              CMA
3010 0F75 56              XAM      HL
3011                   ;
3012 0F76 4E2A   SOUTR0:  LHLI     SERBO     ;BUFFER POINTER
3013 0F78 17              LAI      7         ;P6-2 = OUTPUT
3014 0F79 3FEE            OP       0EH
3015 0F7B 4D46            ORP      6,4
3016 0F7D 4D16            ORP      6,1       ;ENABLE DRIVERS
3017 0F7F 30DA            CALL     SERO      ;LOAD SERIAL OUT REG
3018 0F81 313C            CALL     DELS      ;SHORT DELAY
3019                   ;
3020 0F83 30DA            CALL     SERO
3021 0F85 313C            CALL     DELS
3022                   ;
3023 0F87 30DA            CALL     SERO
3024                   ;
3025 0F89 13              LAI      3
3026 0F8A 3FEE            OP       0EH       ;P6-2 = INPUT
3027 0F8C 20B3            JMP      SERINR
3028                   ;
3029 0F8E 3923   NOTYET:  XADR     SERINC    ;GET DATA BACK
3030 0F90 393B            XADR     COUNT9    ;TEMP STORAGE
3031 0F92 3F92            EI       2
3032 0F94 3633            CALL     LDELAY
3033 0F96 3F82            DI       2
3034 0F98 383B            LADR     COUNT9
3035 0F9A 2F64            JMP      SOUTR1
3036                   ;
3037 0F9C 3E99   SERIR:   ALSC               ;CONTINUE FROM ABOVE
3038 0F9E 7B              XAL
3039 0F9F 3F3A            TSIOAM
3040 0FA1 59              ILS
3041 0FA2 57              ST
3042 0FA3 3D23            IDRS     SERINC    ;BUMP POINTER
3043 0FA5 3E8F            POPDE
3044 0FA7 3E9F            POPHL
3045 0FA9 3944            XADR     TEMPA
3046 0FAB 3F33            SIO
3047 0FAD 3F90            EI       0
3048 0FAF 43              RTPSW
3049                   ;
3050 0FB0 15     TLOCF:   LAI      5
3051 0FB1 393B            XADR     COUNT9
3052 0FB3 4EB8            LHLI     SATTAB+8
3053 0FB5 1F              LAI      0FH
3054 0FB6 5F     TLOCFL:  SKAEM
3055 0FB7 2BA1            JMP      TLOC
3056 0FB9 59              ILS
3057 0FBA 3C3B            DDRS     COUNT9
3058 0FBC B6              JCP      TLOCFL
3059 0FBD 79              SC
```

```
3060  0FBE  53                    RT
3061                        ;
3062  0FBF  10         START: LAI    0
3063  0FC0  3923              XADR   SERINC
3064  0FC2  32B0              CALL   GESAT    ;RESTORE SAT POINTERS
3065  0FC4  3FCB              IP     0BH
3066  0FC6  74                SKABT  0        ;SKIP IF 1 = SLAVE
3067  0FC7  8A                JCP    STRTA
3068  0FC8  37D9              CALL   IQSO     ;ASK FOR INFO
3069                        ;
3070  0FCA  3521       STRTA: CALL   RECALL   ;RESTORE VARIABLES
3071  0FCC  37F8              CALL   JDSAT    ;DISPLAY CURRENT SATELLITE
3072  0FCE  329F              CALL   CHANR    ;DISPLAY CURRENT CHANNEL
3073  0FD0  3262              CALL   AUDIOI   ;INIT AUDIO CHAN AND SYN
3074  0FD2  344E              CALL   CNTDSP   ;OUTPUT COUNTER DISPLAY
3075  0FD4  37F6              CALL   JHOUSE
3076  0FD6  37FC              CALL   JMUT2
3077                        ;
3078  0FD8  D8                CALT   ADC4     ;DIGITIZE AFC DATA
3079                        ;
3080  0FD9  37DE       LOOP:  CALL   JCHKPW
3081  0FDB  4E39              LHLI   POWB+1
3082  0FDD  64                SKMBT  0
3083  0FDE  2E9A              JMP    POWOF
3084  0FE0  3336              CALL   KEYBD
3085  0FE2  3314              CALL   CMDP
3086  0FE4  33E7              CALL   CHKSCN
3087  0FE6  37F4              CALL   JICMDP
3088  0FE8  363F              CALL   CHKMO
3089  0FEA  37EE              CALL   JCHKBL
3090  0FEC  36D8              CALL   CHKINT
3091  0FEE  37E4              CALL   JREST
3092  0FF0  377A              CALL   SERIHD
3093  0FF2  3C3A              DDRS   LPTCNT
3094  0FF4  00                NOP
3095  0FF5  2FD9              JMP    LOOP
3096                        ;
3097  0FF7  15         RESTF0: LAI   0101B
3098  0FF8  3FE7              OP     7
3099  0FFA  3F90              EI     0
3100  0FFC  53                RT
3101                        ;
3102                              END

ERROR =    0
```

What is claimed is:

1. In a satellite television receiver adapted for connection to an associated television monitor, said receiver having means for an operator to select for display on its associated television monitor the programming broadcast by one of a plurality of transponders from one of a plurality of satellites, said satellite receiver having an associated remote control, said remote control having means for an operator to select for display the programming being broadcast by one of a plurality of transponders from one of a plurality of satellites, said satellite television receiver selection means including a programmable microprocessor, the improvement comprising means to program said microprocessor to thereby inhibit access to a selected transponder of a selected satellite, said programming means including said remote control in cooperation with the receiver operator selection means so that both said remote control and said receiver operator selection means are required to program said receiver.

2. The device of claim 1 further comprising means to de-program said microprocessor to thereby restore access to a previously inhibited transponder, said deprogramming means including said remote control in cooperation with the receiver operator selection means so that both said remote control and said receiver operator selection means are required to de-program said receiver.

3. The device of claim 2 wherein the programming means includes means to inhibit access to all of the transponders of a selected satellite as a group, and the de-programming means includes means to restore access to all of the transponders of a selected satellite as a group.

4. The device of claim 1 wherein the receiver further comprises means to communicate with others of said receivers, each receiver having means to be designated as a master or slave.

5. The device of claim 4 further comprising at least one other of said receivers connected to said receiver, one of said receivers being designated as a master and the other being designated as a slave, and wherein said master receiver has means to inhibit access by said slave receiver from those transponders and/or satellites programmed into said master receiver.

6. the device of claim 5 wherein said master receiver further comprises means to restore access by said slave receiver to those transponders and/or satellites de-programmed into said master receiver.

7. The device of claim 5 wherein said master receiver is connected to an antenna for receiving the programming broadcast by said satellites, said master receiver having means to control said antenna and communicate data concerning the positioning of said data to the slave receiver through said communication means.

8. The device of claim 7 wherein said slave receiver has means to control the antenna by communicating its commands through the communication means to the master receiver, the master receiver having means to receive and execute the slave receiver antenna commands.

9. The device of claim 6 wherein said slave receiver has means to inhibit access by said slave receiver only from those transponders and/or satellites programmed into said slave receiver.

10. The device of claim 9 wherein the slave receiver has means to restore access by said slave receiver only to those transponders and/or satellites de-programmed into said slave receiver.

11. A satellite television receiver adapted for connection to (1) an antenna for receiving programming broadcast by any one of a plurality of transponders transmitting from any one of a plurality of satellites, and (2) a television monitor for displaying the programming selected by said receiver, the receiver having means permitting operator selection of any one of said plurality of transponders for display, an associated remote control, said remote control permitting operator selection of any one of said plurality of transponders for display, said receiver transponder selection means including a programmable microprocessor, and means to program said microprocessor to inhibit operator selection of any one or more of said transponders, said programming means including the remote control coacting with the receiver transponder selection means to successfully enter a program inhibiting access to any one or more of said transponders.

12. The device of claim 11 further comprising a second one of said receivers, wherein each of said receivers has means to communicate with at least one other receiver, each of said receivers has means to be designated as a master or slave receiver, said receivers having means to adapt for direct communication to and control of the antenna when designated as a master and means to adapt for direct connection to the master when designated as a slave.

13. The device of claim 12 wherein said receivers have means to inhibit selection of a transponder by a slave in accordance with the programming entered in said master when designated as a master.

14. The device of claim 13 wherein said receivers have means to communicate present antenna positioning information over said communication means to other of said receivers connected thereto.

* * * * *